United States Patent
Yoon et al.

(10) Patent No.: US 9,355,721 B2
(45) Date of Patent: May 31, 2016

(54) RESISTIVE MEMORY DEVICE AND OPERATING METHOD

(71) Applicants: Chi-Weon Yoon, Seoul (KR); Hyun-Kook Park, Anyang-Si (KR); Dae-Seok Byeon, Seongnam-Si (KR)

(72) Inventors: Chi-Weon Yoon, Seoul (KR); Hyun-Kook Park, Anyang-Si (KR); Dae-Seok Byeon, Seongnam-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/800,727

(22) Filed: Jul. 16, 2015

(65) Prior Publication Data

US 2016/0125942 A1 May 5, 2016

(30) Foreign Application Priority Data

Oct. 29, 2014 (KR) .......................... 10-2014-0148455

(51) Int. Cl.
*G11C 11/34* (2006.01)
*G11C 16/04* (2006.01)
*G11C 13/00* (2006.01)

(52) U.S. Cl.
CPC .................................. *G11C 13/0069* (2013.01)

(58) Field of Classification Search
CPC ........... G11C 13/0007; G11C 13/0069; G11C 2213/71; G11C 13/004; G11C 13/0033; G11C 2013/0092; G11C 11/00; G11C 11/16; G11C 16/04; G11C 11/34
See application file for complete search history.

(56) References Cited

U.S. PATENT DOCUMENTS

| 7,889,537 B2 | 2/2011 | Edahiro et al. |
| 8,284,589 B2 | 10/2012 | Scheuerlein |
| 8,395,926 B2 | 3/2013 | Kreupl et al. |
| 8,520,424 B2 | 8/2013 | Kreupl et al. |
| 8,780,621 B2 | 7/2014 | Park et al. |

(Continued)

FOREIGN PATENT DOCUMENTS

| KR | 20130033018 A | 4/2013 |
| KR | 1338360 | 12/2013 |

(Continued)

OTHER PUBLICATIONS

Larentis, Stefano, "Resistive Switching by Voltage-Driven Ion Migration in Bipolar RRAM—Part II: Modeling," IEEE Transactions on Electron Devices, vol. 59, No. 9, Sep. 2012, pp. 2468-2475.

(Continued)

*Primary Examiner* — Hien Nguyen
(74) *Attorney, Agent, or Firm* — Volentine & Whitt, PLLC

(57) ABSTRACT

A method of operating a memory device includes; applying a pre-write voltage to a selected memory cell by applying a first voltage to a first signal line connected to the selected memory cell and a second voltage to a second signal line connected to the selected memory cell during a first set writing interval, wherein a level of the first voltage is higher than a level of the second voltage, and thereafter, applying a write voltage to the selected memory cell by applying a third voltage having a level lower than the level of the first voltage and higher than the level of the second voltage to the first signal line during a second set writing interval.

20 Claims, 28 Drawing Sheets

(56) References Cited

U.S. PATENT DOCUMENTS

| | | | |
|---|---|---|---|
| 8,879,313 | B2 | 11/2014 | Park et al. |
| 8,885,402 | B2 | 11/2014 | Park et al. |
| 9,171,617 | B1 * | 10/2015 | Park .................. G11C 13/0069 |
| 9,183,932 | B1 * | 11/2015 | Kwon ................ G11C 13/0069 |
| 2013/0033929 | A1 | 2/2013 | Kim |
| 2013/0114329 | A1 | 5/2013 | Nickel et al. |
| 2013/0264534 | A1 | 10/2013 | Hwang et al. |
| 2014/0098600 | A1 | 4/2014 | Kim et al. |
| 2014/0104923 | A1 | 4/2014 | Baek et al. |
| 2014/0177321 | A1 | 6/2014 | Park et al. |

FOREIGN PATENT DOCUMENTS

| | | |
|---|---|---|
| KR | 20140045792 A | 4/2014 |
| KR | 20140075346 A | 6/2014 |
| KR | 20140083475 A | 7/2014 |

OTHER PUBLICATIONS

Cagli, C. et al., "Evidence for threshold switchin in the set process of NiO-based RRAM and physical modeling for set, reset, retention and disturb prediction."

Yu, Shimeng et al, "On theStochastic Nature of Resistive Switching in Metal Oxide RRAM: Physical Modeling, Monte Carlo Simulation, and Experimental Characterization."

Baek, I. G. et al, "Multi-layer Cross-point Binary Oxide Resistive Memory (OxRRAM) for Post-NAND Storage Application," 2005 IEEE.

Sekar, D. C. et al, "Technology and Circuit Optimization of Resistive RAM Memory Arrays for Low-Power, Reproucible Operation."

* cited by examiner

RESISTIVE MEMORY DEVICE AND OPERATING METHOD

CROSS-REFERENCE TO RELATED APPLICATIONS

This application claims the benefit of Korean Patent Application No. 10-2014-0148455 filed on Oct. 29, 2014, the subject matter of which is hereby incorporated by reference.

BACKGROUND

The inventive concept relates to memory devices, and more particularly, to resistive memory devices and methods of operating resistive memory devices.

As the demand for high capacity and low power consumption memory devices has increased, research into next-generation memory devices such as non-volatile memory devices that do not require a refresh operation has been actively conducted. Such next-generation memory devices are expected to have high integration density of the Dynamic Random Access Memory (DRAM), the nonvolatile data storage capabilities of flash memory, and the high data access capabilities of the static RAM (SRAM). Phase-change RAM (PRAM), Nano Floating Gate Memory (NFGM), Polymer RAM (PoRAM), Magnetic RAM (MRAM), Ferroelectric RAM (FeRAM), and Resistive RAM (RRAM) have been highlighted as some of the next-generation memory devices.

SUMMARY

Embodiments of the inventive concept provide memory devices capable of improving durability of constituent memory cells, improving the operation of memory cells across a distribution of memory cells in a memory cell array. Embodiments of inventive concept also provide methods of operating the memory device, wherein a surge current potentially generated during the writing of data to a selected memory cell is suppressed.

According to an aspect of the inventive concept, there is provided a method of operating a memory device including a selected memory cell connected to a first signal line and a second signal line in a memory cell array. The method includes; applying a pre-write voltage to the selected memory cell by applying a first voltage to the first signal line and a second voltage to the second signal line during a first set writing interval, wherein a level of the first voltage is higher than a level of the second voltage, and thereafter, applying a write voltage to the selected memory cell by applying a third voltage having a level lower than the level of the first voltage and higher than the level of the second voltage to the first signal line during a second set writing interval.

According to another aspect of the inventive concept, there is provided a method of operating a memory device including a selected memory cell connected to a first signal line and a second signal line in a memory cell array including a plurality of memory cells arranged in a first region and a second region. The method include; applying a pre-write voltage pulse to the selected memory cell having a level defined by applying a first voltage to the first signal line and applying a second voltage to the second signal line during a first set writing interval, wherein a level of the second voltage is lower than a level of the first voltage, and thereafter, applying a write voltage to the selected memory cell by applying a third voltage having a level lower than the level of the first voltage and higher than the level of the second voltage to the second signal line during a second set writing interval, and defining at least one of the level of the pre-write voltage pulse and a duration of the first set writing interval in accordance with a disposition of the selected memory cell in either the first region or the second region.

According to another aspect of the inventive concept, there is provided a method of operating a memory device including a selected memory cell connected to among a plurality of memory cells arranged respectively at points in a memory cell array where first signal lines cross second signal lines. The method includes; applying a pre-write voltage to the selected memory cell, and supplying a current pulse to the selected memory cell, wherein the application of the pre-write voltage to the selected memory cell begins a changing of a resistance state of the memory cell, and applying a write voltage having a level different from a level of the pre-write voltage to the selected memory cell, wherein application of the write voltage to the selected memory cell suppresses an among of current passing through the selected memory cell relative to the application of the first voltage to the selected memory cell.

BRIEF DESCRIPTION OF THE DRAWINGS

Embodiments of the inventive concept may be understood upon consideration of the following detailed description taken in conjunction with the accompanying drawings in which.

DETAILED DESCRIPTION

Figure 1:
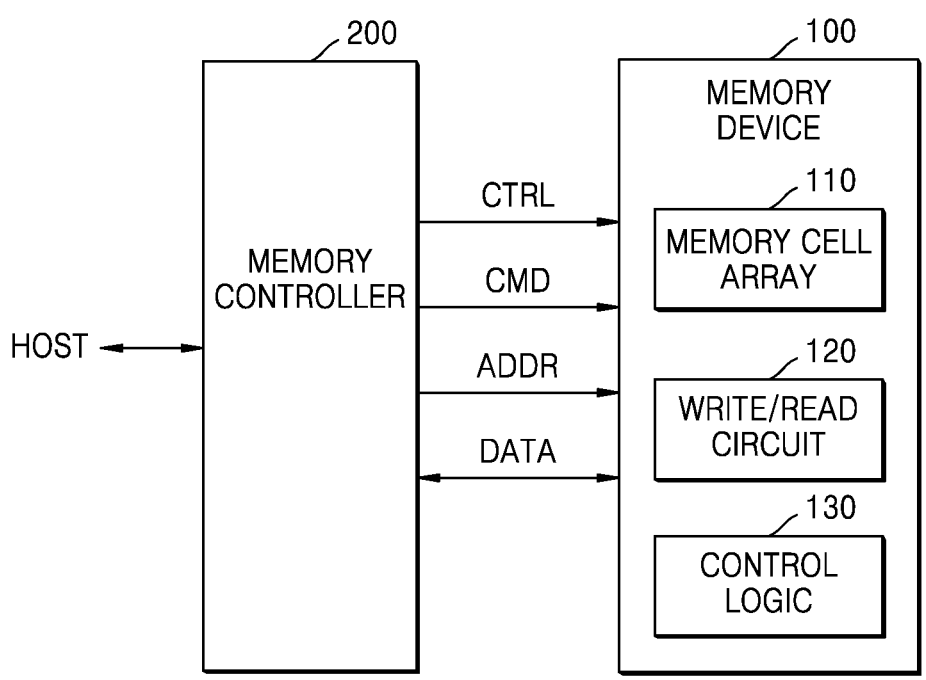
FIG. 1 is a block diagram illustrating a memory system including a resistive memory device according to an embodiment of the inventive concept.

Embodiments of the inventive concept will now be described more fully with reference to the accompanying drawings. The inventive concept may, however, be embodied in many different forms, and should not be construed as being limited to the embodiments set forth herein. Thus, the scope of the inventive concept include revisions, equivalents, modifications and substitutions relative to the illustrated embodiments. Throughout the written description and drawings like reference numbers and labels are used to denote like or similar elements. In the drawings, certain sizes, relative sizes and/or relative dimensions may be exaggerated for clarity.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components and/or groups thereof.

While terms "first" and "second" are used to describe various components, it is obvious that the components are not limited to the terms "first" and "second". The terms "first" and "second" are used only to distinguish between each component. For example, a first component may indicate a second component or a second component may indicate a first component without conflicting with the inventive concept.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram of a memory system 10 including a resistive memory device 100 according to an embodiment of the inventive concept.

Referring to FIG. 1, the memory system 10 may include the resistive memory device 100 (hereinafter, referred to simply as a "memory device") and a memory controller 200. The memory device 100 includes a memory cell array 110, a write/read circuit 120, and a control logic 130. Also, the memory device 100 may further include circuits performing writing and reading operations on the memory cell array 110 according to control of the control logic 130. Since the memory cell array 110 includes resistive memory cells, the memory system 10 may be called a resistive memory system.

In response to a write/read request from a host, the memory controller 200 may control the memory device 100 to read data stored in the memory device 100 or to write data to the memory device 100. In more detail, the memory controller 200 may provide an address ADDR, a command CMD, and a control signal CTRL to the memory device 100 and thus may control a program (or write) operation, a read operation, and an erase operation with respect to the memory device 100. Also, data DATA to be written and data DATA to be read may be exchanged between the memory controller 200 and the memory device 100.

Although not illustrated, the memory controller 200 may include Random Access Memory (RAM), a processing unit, a host interface, and a memory interface. The RAM may be used as an operation memory of the processing unit. The processing unit may control operations of the memory controller 200. The host interface may include a protocol for exchanging data between the host and the memory controller 200. For example, the memory controller 200 may communicate with an external source (i.e., the host) by using at least one of various interface protocols including USB, MMC, PCI-E, Advanced Technology Attachment (ATA), Serial-ATA, Parallel-ATA, SCSI, ESDI, and Integrated Drive Electronics (IDE).

The memory cell array 110 may include a plurality of memory cells (not shown) that are disposed respectively in regions where a plurality of first signal lines and a plurality of second signal lines cross each other. According to certain embodiments, the plurality of first signal lines is a plurality of bit lines and the plurality of second signal lines is a plurality of word lines, or vice versa.

In the illustrated embodiment of FIG. 1, each of the memory cells may be a single level cell (SLC) that stores one bit data, or may be a multilevel cell (MLC) that may store at least two-bit data. Alternatively, the memory cell array 110 may include both SLCs and MLCs. When one bit data is written to one memory cell, the memory cells may have two resistance level distributions according to the written data. Alternatively, when two-bit data is written to one memory cell, the memory cells may have four resistance level distributions according to the written data. In another embodiment, if a memory cell is a triple level cell (TLC) that stores three-bit data, the memory cells may have eight resistance level distributions according to the written data. However, one or more embodiments of the inventive concept are not limited thereto. Thus, in other embodiments, each of the memory cells may store at least four-bit data.

Also, in the present embodiment, the memory cell array 110 may include memory cells having a two-dimensional horizontal structure. In another embodiment, the memory cell array 110 may include memory cells with a three-dimensional vertical structure.

According to the embodiment, the memory cell array 110 may include a plurality of cell regions. The plurality of cell regions may be defined in various ways, for example, each of the cell regions may be a page unit including a plurality of memory cells connected to the same word line. As another example, the cell region may include a plurality of memory cells that are connected to the word lines and bit lines, and the word lines may be connected to one row decoder (or row selection block) and the bit lines may be connected to one column decoder (or column selection block). In addition, the cell region may be defined as a tile.

The memory cell array 110 may include resistance-type memory cells or resistive memory cells that include a variable resistor device (not shown) having a variable resistor. For example, when the resistance of the variable resistor device that is formed of a phase change material (e.g., Ge—Sb—Te) changes according to temperature, a resistive memory device may be Phase-change RAM (PRAM). As another example, when the variable resistor device is formed of complex metal oxide including an upper electrode, a lower electrode, and transition metal oxide therebetween, the resistive memory device may be Resistive RAM (RRAM). As another example, when the variable resistor device is formed of an upper electrode of a magnetic material, a lower electrode of a magnetic material, and a dielectric therebetween, the resistive memory device may be Magnetic RAM (MRAM). Hereinafter, it is assumed that the memory cell array 110 is RRAM.

The write/read circuit 120 may be used to perform write and read operations on the memory cells. The write/read circuit 120 is connected to the memory cells via the plurality of bit lines, and may include a write driver for writing data in the memory cells and a sense amplifier for amplifying data read from the memory cells.

The control logic 130 may control overall operations of the memory device 100, and may control the write/read circuit 120 for performing memory operations such as the read and write operations. For example, the memory device 100 may include a power generation unit (not shown) for generating various write voltages and read voltages used in the write and read operations, and levels of the write and read voltages may be adjusted according to a control of the control logic 130.

When performing a write operation on the memory device 100, a resistance value of the variable resistor of the memory cell in the memory cell array 110 may increase or may reduce according to written data. For example, each of the memory cells in the memory cell array 110 may have a resistance value according to currently stored data, and the resistance value may be increased or decreased according to the value of the data to be written to selected memory cell(s). These different type of write operations may be classified as a reset write operation and a set write operation. In the resistive memory cell, the 'set' state will cause the memory cell to exhibit a relatively low resistance value, while the 'reset' state will cause the memory cell to exhibit a relatively high resistance value. The reset write operation is performed in a direction in which the value of the variable resistor increases, and the set write operation is performed in a direction in which the value of the variable resistor is decreased.

In addition, according to a method of writing the data in the memory device 100 consistent with the illustrated embodiment, a pre-write voltage pulse (hereinafter, "pre-write voltage") for triggering a state change in the resistance of the memory cell is applied to a selected memory cell at an initial stage of the write operation. After that, when the resistance state of the memory cell begins to change, a "write voltage" having a level lower than that of the pre-write voltage is applied to the memory cell, and a "write current" is supplied to the memory cell so that the resistance value of the memory cell may complete its state change to be consistent with the data value to be written.

According to one embodiment, the pre-write voltage is applied to the selected memory cell by applying a high voltage to a first signal line connected to the selected memory cell and applying a low voltage to a second signal line connected to the selected memory cell, after that, the voltage level of the voltage applied to the first signal line is decreased, and the write current is applied via the second signal line.

According to another embodiment, the pre-write voltage is applied to the selected memory cell by applying a high voltage to the first signal line while applying a low voltage to the second signal line. Then, the level of the low voltage applied to the second signal line is increased, and the write current is applied via the first signal line.

In the foregoing, the first signal line may be a word line and the second signal line may be a bit line, or vice verses.

When performing a write operation on the memory device 100 of FIG. 1, after a predetermined time (hereafter, a "write begin time") has elapsed following the application of the write voltage to a selected memory cell, the resistance state of the selected memory cell begins to change. Once the resistance state of the selected memory cell begins to change, a surge current may occur due to a parasitic capacitance between the bit line(s) and/or word line(s). In particular, if the resistance state of the memory cell is changed from a high resistance state (HIGH) to a low resistance state (LOW), a surge current having a relatively high peak current value may occur in relation to the charging/discharging of the parasitic capacitance.

As described above, certain approaches to the writing of data in a memory device, like memory device 100 of FIG. 1, use a pre-write voltage to initially trigger a change in the resistance state of the memory cell, and then, once the resistance state of the memory cell begins to change, the level of a write voltage applied to the memory cell may be decreased. This approach decreases the likelihood that a surge current, due to parasitic signal line capacitance, may occur. As a result, the overall durability of the memory device 100 may be improved. In addition, distribution of the memory cells may be improved by improving adjustability of the change in the resistance state of the memory cell.

Regarding the embodiments illustrated in FIG. 1, the memory controller 200 and memory device 100 may be commonly integrated as single semiconductor device. For example, the memory controller 200 and memory device 100 may be integrated in the form of a memory card, such as a PC card, PCMCIA card, compact flash card (CF card), smart media card (SM/SMC), memory stick, multimedia card (e.g., MMC, RS-MMC, or MMCmicroO, SD card, miniSD, or microSD), or universal flash storage (UFS). Further, the memory controller 200 and memory device 100 may be integrated as a Solid State Disk/Drive (SSD).

Certain exemplary approaches to the operation of the memory device 100 of FIG. 1 will now be described with reference to FIGS. 2 and 3.

Figure 2:
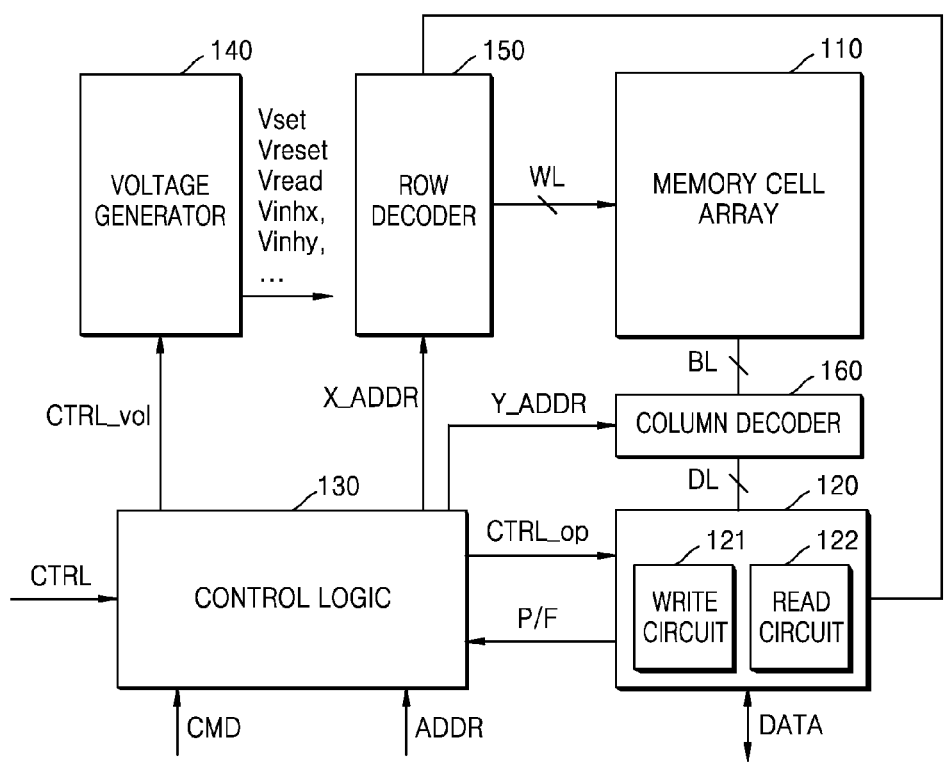
FIG. 2 is a block diagram further illustrating the memory device 100 of FIG. 1.

FIG. 2 is a block diagram further illustrating in one example the memory device 100 of FIG. 1.

Referring to FIG. 2, the memory device 100 is illustrated as comprising the memory cell array 110, write/read circuit 120 and control logic 130, as well as a voltage generator 140, a row decoder 150 and a column decoder 160, where the write/read circuit 120 includes a write circuit 121 and a read circuit 122.

The memory cell array 110 includes the plurality of first signal lines and the plurality of second signal lines. Also, the memory cell array 110 may include a plurality of memory cells that are respectively arranged on region where the plurality of first signal lines and the plurality of second signal lines cross each other. Hereinafter, it is assumed that the plurality of first signal lines are word line WL, and the plurality of second signal lines are bit lines BL.

An address ADDR for indicating an access-target memory cell may be received with a command CMD. The address ADDR may include a row address X_ADDR for selecting a word line WL of the memory cell array 110, and a column address Y_ADDR for selecting a bit line BL of the memory cell array 110. The row decoder 150 is connected to the memory cell array 110 via the word lines WL, and may select at least one of the word lines in response to the row address X_ADDR.

The column decoder 160 is connected to the memory cell array 110 via the bit lines BL, and may select at least one of the bit lines BL in response to the column address Y_ADDR.

The write/read circuit 120 is connected to the bit line BL via the column decoder 160 to write data in the memory cell or to read data from the memory cell. The write/read circuit 120 may write data DATA input from outside in the memory cell array 110 or output the data written in the memory cell array 110, according to control of the control logic unit 130. Also, the write/read circuit 120 may provide the control logic unit 130 with a writing or reading result RST_WR. For example, the write/read circuit 120 performs a verification operation in order to detect the result of the write operation, and may provide the control logic unit 130 with the verification result, for example, pass or fail signal P/F.

The write/read circuit 120 may be selectively connected to the row decoder 150 or the column decoder 160, and accordingly, is selectively connected to the word line WL or the bit line BL to write data in the memory cell or read data from the memory cell.

The write/read circuit 120 may include a write circuit 121 and a read circuit 122. The write circuit 121 is connected to the selected bit line BL via the column decoder 160 to provide the selected memory cell MC with a program pulse, and thus, performs a programming operation (that is, the write operation). Thus, the data DATA to be stored may be input to the memory cell array 110. Here, the programming pulse may be referred to as a writing pulse. In the embodiment, the programming pulse may be a current pulse. In another embodiment, the program pulse may be a voltage pulse.

In detail, the write circuit 121 may perform the set write operation that programs the memory cell MC so that the resistance of the memory cell MC is reduced. Also, the write circuit 121 may perform the reset write operation that programs the memory cell MC so that the resistance of the memory cell MC is increased.

The read circuit 122 is connected to the selected bit line BL via the column decoder 160, and may read the data DATA by sensing the resistance level of the selected memory cell MC. Thus, the data DATA stored in the memory cell array 110 may be output.

In detail, the read circuit 122 may perform a general reading operation on the memory cell MC if a reading command is transmitted from the memory controller 200. Also, the read circuit 122 may perform the reading operation on the memory cell MC before performing the write operation on the memory cell MC, that is, a pre-reading operation for reading an initial resistance state of the memory cell MC.

Moreover, the read circuit 122 may perform a verify reading operation for determining whether the writing in the memory cell MC is finished, after performing the write operation on the memory cell MC.

In a general reading operation, the read circuit 122 may provide the read data DATA to outside of the memory device 100, for example, the memory controller 200. Also, in the pre-reading operation or the verify reading operation, the read circuit 122 may provide the read data DATA or a P/F signal representing whether the reading or writing of the data has succeeded or not to inside of the memory device 100, for example, the control logic unit 130 or the write circuit 121, as a result of the writing/reading operations.

In certain embodiments, the write circuit 121 and read circuit 122 are connected to one or more word lines WLs. In other embodiments, the write circuit 121 and read circuit 122 are connected to one or more the bit line BL(s). In still other embodiments, the write circuit 121 is connected to a word line WL, and the read circuit 122 is connected to the bit line BL. And in still other embodiments, the write circuit 121 is connected to a bit line BL and the read circuit 122 is connected to a word line WL.

The voltage generator 140 may be used to generate various voltages for performing the write, read, and/or erase operations with respect to the memory cell array 110 based on a voltage control signal CTRL_vol received from the control logic 130. The voltage generator 140 may generate voltages used to drive the plurality of word lines WL and bit lines BL, such as a set write voltage Vset, a reset write voltage Vreset, a row inhibit voltage Vinhx, a column inhibit voltage Vinhy, etc.

Here, the set write voltage Vset includes a set high voltage and a set low voltage respectively applied to the word line WL and the bit line BL when performing the set write operation. For example, the set low voltage may be a ground voltage. When the set high voltage is applied to the selected word line WL and the set low voltage is applied to the selected bit line BL, and thus, the set write voltage or the set write voltage pulse may be applied to the selected memory cell. Also, the reset write voltage Vreset may include a reset high voltage or a reset low voltage respectively applied to the word line WL and the bit line BL when performing the reset write operation.

According to certain embodiments of the inventive concept, the voltage generator 140 may be used to generate a plurality of set high voltages and a plurality of set low voltages. As described above with reference to FIG. 1, in the memory device 100 according to embodiments of the inventive concept, the voltage applied to the memory cell may be gradually adjusted when performing the set write operation. Accordingly, the plurality of set high voltages or the plurality of set low voltages generated by the voltage generator 140 may be sequentially applied to appropriate signal lines (e.g., word line and/or bit line) connected to the selected memory cell to which the write operation is directed.

The control logic unit 130 may be used to configure and provide various control signals used during the writing of data or the reading of data relative to the memory cell array 110 in response to one or more command(s) CMD, address(es) ADDR, and/or control signal(s) CTRL provided by the memory controller 200. The various control signals provided by the control logic unit 130 may be provided to the write/read circuit 120, voltage generator 140, row decoder 150, and/or column decoder 160, whereby the control logic unit 130 may control the overall operation of the memory device 100.

The control logic unit 130 may further be used to generate various operation control signals CTRL_op based on the command CMD and/or control signal CTRL, and may provide the write/read circuit 120 with the various operation control signals CTRL_op.

Still further, the control logic unit 130 may provide the row decoder 150 with a row address X_ADDR, and may provide the column decoder 160 with a column address Y_ADDR.

The control logic 130 may also be used to generate a voltage control signal CTRL_vol based on the command CMD and/or control signal CTRL, as well as a pass/fail (P/F) signal provided to the read circuit 122. The control logic 130 may also be used to provide the voltage generator 140 with the voltage control signal CTRL_vol.

According to certain embodiment embodiments of the inventive concept, a pre-write voltage is applied to a selected memory cell during an initial stage of a write operation currently being executed. In response to the application of the pre-write voltage, the resistance state of the selected memory cell begins to change during a write begin time. Once the resistance state begins to change (i.e., following expiration of the write begin time), at least one voltage applied to the memory cell is changed (i.e., increased or decreased). The control logic 130 may be used to determine the nature of certain signals that will be applied to one or more selected memory cells during a write operation or a read operation. For example, during a write operation the control logic 130 may determine a level for the pre-write voltage, the duration of the write begin time, a slew rate for the pre-write voltage, respective levels for the write voltage applied after expiration of the write begin time, the waveform (e.g., pulse shape, duration, etc.) of the pre-write voltage, as well as the nature of the corresponding control signals (e.g., CTRL_op, CTRL_vol, etc.).

Figure 3:
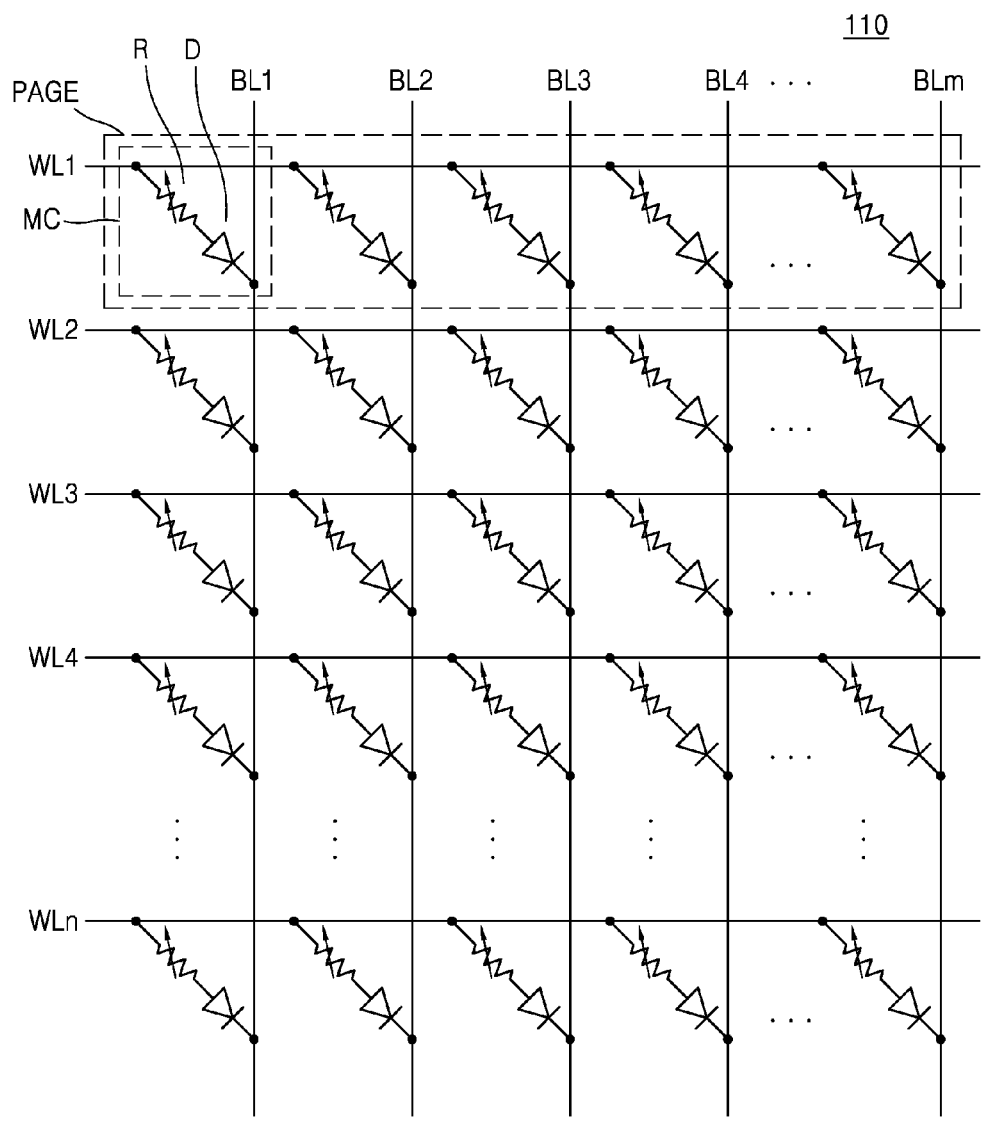
FIG. 3 is a partial circuit diagram illustrating in one example the memory cell array 110 of FIG. 2.

FIG. 3 is a partial circuit diagram further illustrating in one example the memory cell array 110 of FIG. 2. In commercially useful embodiments the memory cell array 110 will usually include a plurality of cell blocks, however, FIG. 3 illustrates only the relevant portions of a single cell block for the sake of clarity.

Referring to FIG. 3, the memory cell array 110 is assumed to include a plurality of memory cells arranged in a horizontal structure. As noted above, the memory cell array 110 includes a plurality of word lines WL1-WLn, a plurality of bit lines BL1-BLm, and a plurality of memory cells MCs. A group of the memory cells MC selected by the same word line WL is referred to as a page PAGE. Here, despite the fact that FIG. 3 shows a two-dimensional memory having a horizontal structure, other embodiments of the memory cell array 110 will include memory cells arranged in a three-dimensional or vertical structure.

In FIG. 3, each of the plurality of memory cells MC is assumed to include a variable resistive device R and a selection device D. Here, the variable resistance device R may be referred to as a variable resistance material, and the selection device D may be referred to as a switching device.

In FIG. 3, the variable resistance device R is connected between one of the plurality of bit lines BL1-BLm and the selection device D, and the selection device D may be connected between the variable resistance device R and one of the plurality of word lines WL1-WLn. However, other embodiments of the inventive concept are not limited to this particular structure and the selection device D may be connected between one of the plurality of bit lines BL1-BLm and the variable resistance device R, and the variable resistance device R may be connected between the selection device D and one of the plurality of word lines WL1-WLn.

Here, the variable resistance device R may be switched to one of a plurality of resistance states by an electric pulse applied thereto. The variable resistance device R may include a phase-change material, a crystallization status of which varies depending on an amount of applied electric current. The phase-change material may vary, and may be, for example, GaSb, InSb, InSe, $Sb_2Te_3$, or GeTe that are compounds of two elements, GeSbTe, GaSeTe, InSbTe, $SnSb_2Te_4$, or InSbGe that are compounds of three elements, and AgInSbTe, (GeSn)SbTe, GeSb(SeTe), or $Te_{81}Ge_{15}Sb_2S_2$ that are compounds of four elements.

The phase-change material may have an amorphous state having a relatively high resistance and a crystalline state having a relatively low resistance. The phase of the phase-change material may be changed by Joule's heat generated according to the amount of electric current. In addition, the data may be written by using the phase change.

In addition, according to another embodiment of the present inventive concept, the variable resistance device R may include perovskite compounds, transmission metal oxide, magnetic materials, ferromagnetic materials, or anti-ferromagnetic materials, instead of the phase-change material.

The selection device D may be connected between one of the plurality of word lines WL1-WLn, and the variable resistance material R, and may control supply of the electric current to the variable resistance device R according to a voltage applied to the connected word line and the bit line. In the present embodiment, the selection device D may be a PN junction diode or a PIN junction diode. An anode of the device D may be connected to the variable resistance device R and a cathode of the diode may be connected to one of the plurality of word lines WL1-WLn. Here, if a voltage difference between the anode and the cathode of the diode becomes greater than a threshold voltage of the diode, the diode is turned on so as to supply the electric current to the variable resistance device R. In FIG. 3, the selection device D is shown as a diode; however, one or more embodiments of the inventive concept are not limited thereto, that is, the selection device D may be another device that may be switched.

Figure 4:
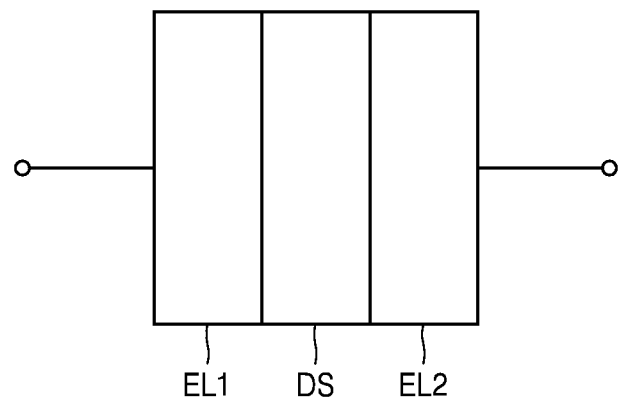
FIG. 4 is a block diagram illustrating in one example a variable resistor device that may be included in the respective memory cell(s) of FIGS. 2 and 3.

FIG. 4 is a diagram of the variable resistance device R that may be included in the memory cell array 110 of FIGS. 1, 2 and 3.

Referring to FIG. 4, the variable resistance device R may include first and second electrodes EL1 and EL2, and a data storage film DS disposed between the first and second electrodes EL1 and EL2.

The first and second electrodes EL1 and EL2 may be formed of various metals, metal oxides, or metal nitrides. The first and second electrodes EL1 and EL2 may be formed of aluminium (Al), copper (Cu), titanium nitride (TiN), titanium aluminium nitride (TixAlyNz), iridium (Ir), platinum (Pt), silver (Ag), gold (Au), poly silicon, tungsten (W), titanium (Ti), tantalum (Ta), tantalum nitride (TaN), tungsten nitride (WN), nickel (Ni), cobalt (Co), chrome (Cr), antimony (Sb), iron (Fe), molybdenum (Mo), palladium (Pd), tin (Sn), zirconia (Zr), zinc (Zn), iridium oxide ($IrO_2$), or strontium zirconate oxide ($StZrO_3$).

The data storage film DS may be a bipolar resistive memory material or a unipolar resistive memory material. The bipolar resistive memory material may be programmed as a set state or a reset state according to a polarity of the pulse, and the unipolar resistive memory material may be a perovskite-based material. In addition, the unipolar resistive memory material may be programmed as a set state or a reset state according to the pulses of the same polarity, and the unipolar resistive memory material may be a transition metal oxide such as NiOx or TiOx.

Figure 5A:
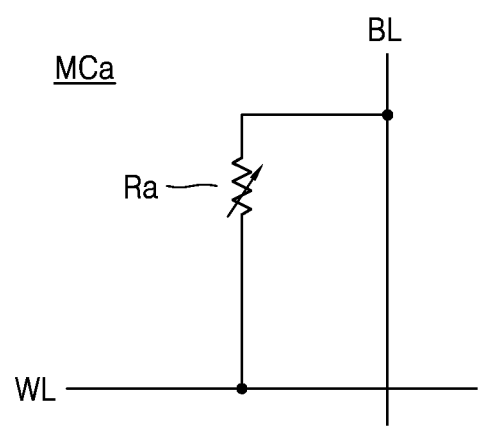
FIGS. 5A, 5B and 5C are respective circuit diagrams illustrating certain examples of memory cells that may be incorporated in the memory cell array of FIGS. 2 and 3.
Figure 5B:
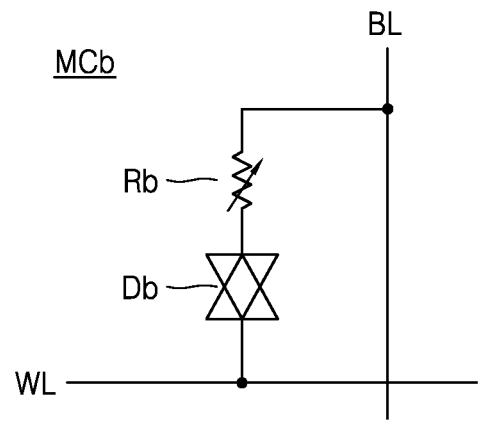
Figure 5C:
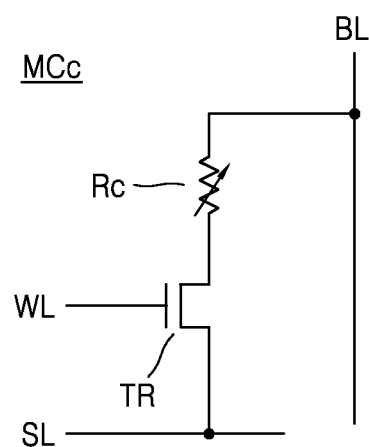

FIGS. 5A, 5B and 5C are respective circuit diagrams illustrating various examples for the memory cell MC shown in FIG. 3.

Referring to FIG. 5A, a memory cell MCa includes a variable resistance device Ra, and the variable resistance device Ra may be connected between a bit line BL and a word line WL. The memory cell MCa may store data by using voltages applied to the bit line BL and the word line WL.

Referring to FIG. 5B, a memory cell MCb may include a variable resistance device Rb and a bidirectional diode Db. The variable resistance device Rb may include a resistor material for storing data. The bidirectional diode Db is connected between the variable resistance device Rb and the word line WL, and the variable resistance device Rb may be connected between the bit line BL and the bidirectional diode Db. Locations of the bidirectional diode Db and the variable resistance device Rb may be exchanged. A leakage current flowing in non-selected resistor cells may be blocked by the bidirectional diode Db.

Referring to FIG. 5C, a memory cell MCc may include a variable resistance device Rc and a transistor TR. The transistor TR may be a selection device for supplying or blocking the electric current to the variable resistance device Rc according to a voltage of the word line WL, that is, a switching device. The transistor TR is connected between the variable resistance device Rc and the source line SL, and the variable resistance device Rc may be connected between the bit line BL and the transistor TR. Locations of the transistor TR and the variable resistance device Rc may be exchanged. The memory cell MCc may be selected or may not be selected according to turning on/turning off of the transistor TR that is driven by the word line WL.

Figure 6A:
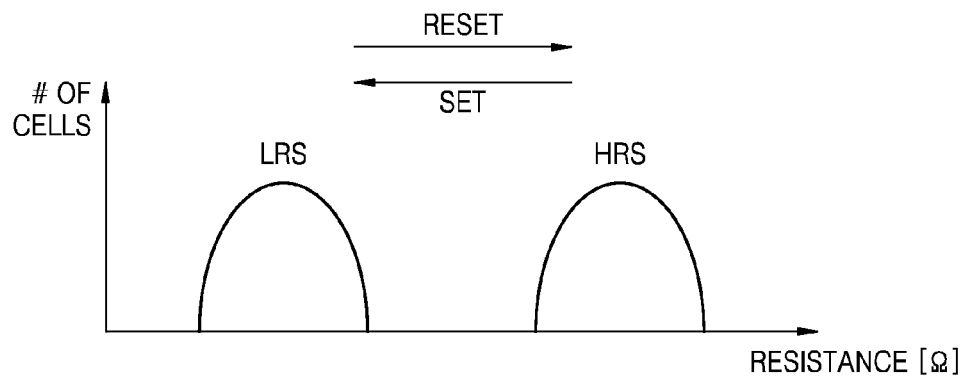
FIGS. 6A and 6B are conceptual diagrams illustrating certain memory cell resistance distributions that may be obtained using single bit and multiple bit resistive memory cells.
Figure 6B:
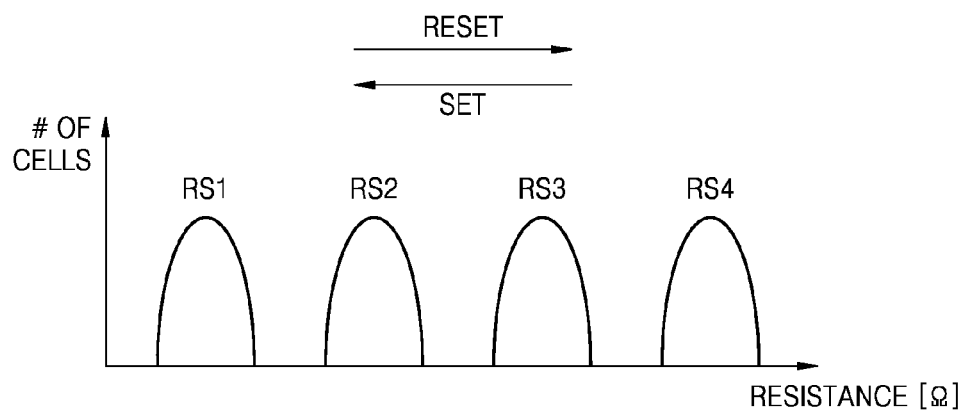

FIGS. 6A and 6B are respective graphs illustrating resistance distributions for single bit and two-bit memory cells MC. FIG. 6A shows a case where the memory cell MC is a single level memory cell (SLC), and FIG. 6B shows a case where the memory cell MC is a multi-level memory cell MLC. In each of FIGS. 6A and 6B, the horizontal axis indicates resistance, and the vertical axis indicates a number of memory cells MC.

Referring to FIG. 6A, if the memory cell MC is a single level cell SLC programmed with one bit, the memory cell MC may have a low resistance state LRS or a high resistance state HRS. In the present embodiment, resistance states RS1 through RS4 may be classified as the high resistance states HRS and the low resistance states LRS based on a critical resistance level Rref. The low resistance state LRS may be referred to as the set state, and the high resistance state HRS may be referred to as the reset state.

The low resistance state LRS and the high resistance state HRS may respectively correspond to one of data '0' and data '1'. In the present embodiment, the resistance level R may increase from data '0' to data '1'. The low resistance state LRS may correspond to data '0' and the high resistance state HRS may correspond to data '1'.

An operation of applying the write pulse to the memory cell MC to switch the memory cell MC from the high resistance state HRS to the low resistance state LRS is referred to as a set operation or a set write operation. Also, an operation of applying the write pulse to the memory cell MC to switch the memory cell MC from the low resistance state LRS to the high resistance state HRS is referred as a reset operation or a reset write operation.

Referring to FIG. 6B, if the memory cell MC is the multi-level cell programmed with two bits, a resistance value of the memory cell MC may have one of a first resistance state RS1, a second resistance state RS2, a third resistance state RS3, and a fourth resistance state RS4.

However, one or more embodiments are not limited thereto, that is, in another embodiment, the plurality of memory cells MC may include triple level cells TLCs storing data of three bits. Accordingly, the memory cells may have one of eight resistance states according to the written data. In another embodiment, the plurality of memory cells MC may include memory cells storing data of four-bits or greater.

Since the multi-level cell MLC has narrower intervals between resistance distributions than those of the single level cell SLC, a read error is more likely to occur due to a small variation in the resistance. Therefore, the resistance states RS1, RS2, RS3, and RS4 may have resistor ranges that do not overlap with each other in order to ensure a read margin.

In FIG. 6B, the resistance states RS1 through RS4 may be classified as the high resistance state (HRS) and the low resistance state (LRS) based on the critical resistance level Rref. For example, as shown in FIGS. 6A and 6B, if the critical resistance level Rref is located between the first resistance state RS1 and the second resistance state RS2, the second resistance state RS2, the third resistance state RS3, and the fourth resistance state RS4 that are lower than the critical resistance level Rref may be referred to as the low resistance states LRS. In addition, the first resistance state RS1 that is greater than the critical resistance level Rref may be referred to as the high resistance state HRS. Also, the low resistance state LRS may be referred to as the set state, and the high resistance state HRS may be referred to as the reset state.

Each of the first, second, third, and fourth resistance states RS1, RS2, RS3, and RS4 may correspond to one of data '00', data '01', data '10', and data '11'. In the present embodiment, the resistance level R may increase in order of the data '11', the data '01', the data '00', and the data '10'. That is, the fourth resistance state RS4 may correspond to the data '11', the third resistance state RS3 may correspond to the data '01', the second resistance state RS2 may correspond to the data '00', and the first resistance state RS1 may correspond to the data '10'.

Figure 7:
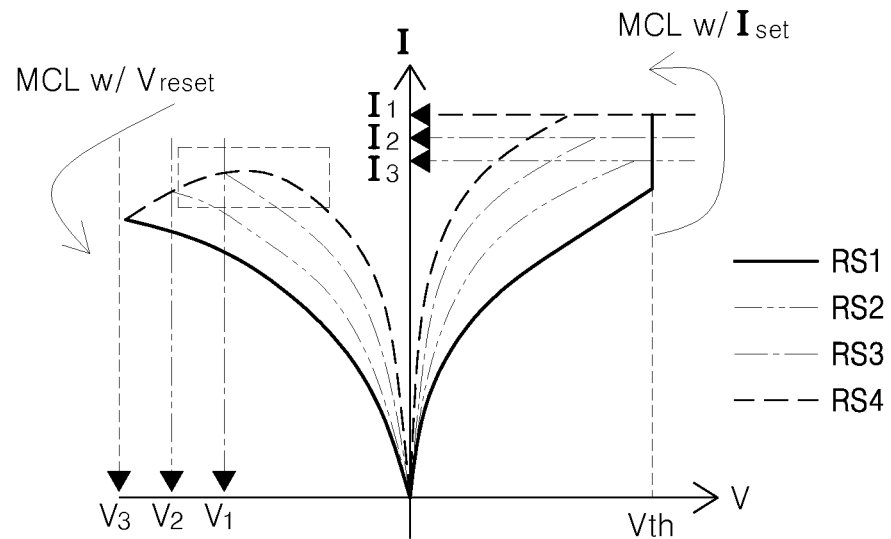
FIG. 7 is a graph illustrating exemplary voltage-current characteristic curves for memory cells that may be incorporated in the memory cell array of FIG. 2.

FIG. 7 is a graph illustrating an exemplary voltage-current characteristic curve for a memory cell MC that might be incorporated in the memory cell array 110 of FIGS. 1, 2 and 3.

Referring to FIG. 7, the horizontal axis indicates voltage V, and the vertical axis indicates current I. If the memory cell MC is a multi-level cell MLC, the memory cell MC may have one of the plurality of resistance states according to data stored therein. For example, as shown in FIG. 7, the memory cell MC may have one of the first to fourth resistance states RS1, RS2, RS3, and RS4. Here, the resistance level is the largest when the memory cell MC is in the first resistance state RS1, and the resistance level is the smallest when the memory cell MC is in the fourth resistance state RS4.

As shown in right side of the graph of FIG. 7, the resistance level of the memory cell MC may be reduced through the set write operation. On the contrary, as shown in left side of the graph, the resistance level of the memory cell MC may be increased through the reset write operation.

In addition, when a voltage that is equal to or greater than a threshold voltage Vth is applied to the memory cell MC, the current flowing in the memory cell MC is increased rapidly, and it is not easy to control the current for writing the resistance level according to the data to be programmed. Therefore, in the present embodiment, when the set write operation is performed on the memory cell MC, a write current Iset or a write current pulse may be supplied to the memory cell MC.

When the set write current Iset or the set write current pulse is supplied to the memory cell MC, the resistance state of the memory cell MC may be changed to a relatively high resistance state when comparing with the current resistance state. A degree of changing the resistance state of the memory cell MC may vary depending on the magnitude of the set write current Iset or the set write current pulse. For example, as shown in FIG. 7, when the memory cell MC is in the first resistance state RS1, the resistance state RS1 may be switched to one of the second to fourth resistance states RS2-RS4 according to the magnitude of the set write current Iset or the set write current pulse supplied to the memory cell MC.

In order to perform a reset write operation, the current supplied to the memory cell MC has to be adjusted so as to rise to a peak current (denoted as a dashed line box in FIG. 7) and to decrease, and thus, it is not easy to perform the reset write operation on the memory cell MC by using a general square pulse. Therefore, when performing the reset write operation on the memory cell MC, a write voltage pulse Vreset may be applied to the memory cell MC.

When the reset write voltage Vreset or the reset write voltage pulse is applied to the memory cell MC, the resistance state of the memory cell MC may be switched to a relatively low resistance state when comparing with the current resistance state. A degree of switching the resistance state of the memory cell MC may vary depending on the magnitude of the reset write voltage Vreset or the reset voltage pulse. For example, as shown in FIG. 7, when the memory cell MC is in the fourth resistance state RS4, the resistance state of the memory cell MC may be switched to one of the first to third resistance states RS1 to RS3 according to the magnitude of the reset write voltage Vreset or the reset write voltage pulse.

In addition, when performing the set write operation, in order to switch the resistance state of the memory cell MC, a voltage for triggering the change in the resistance state of the memory cell MC (hereinafter, referred to as a trigger voltage) has to be applied to the memory cell MC. Here, the resistance state of the memory cell MC starts to change after the trigger voltage is applied to the memory cell MC for a predetermined time period. Here, the trigger voltage and the above predetermined time period may vary depending on a material of the variable resistor device R of the memory cell MC.

According to the writing method on the memory device 100, the pre-write voltage pulse or the pre-write voltage is applied to the memory cell MC at an initial state of the write operation, and after that, when the resistance state of the memory cell MC starts to change, the level of voltage applied to the memory cell MC is reduced and the magnitude of the set write current Iset or the set write current pulse is adjusted to switch the resistance state of the memory cell MC to a desired state, for example, a target resistance state.

Figure 8:
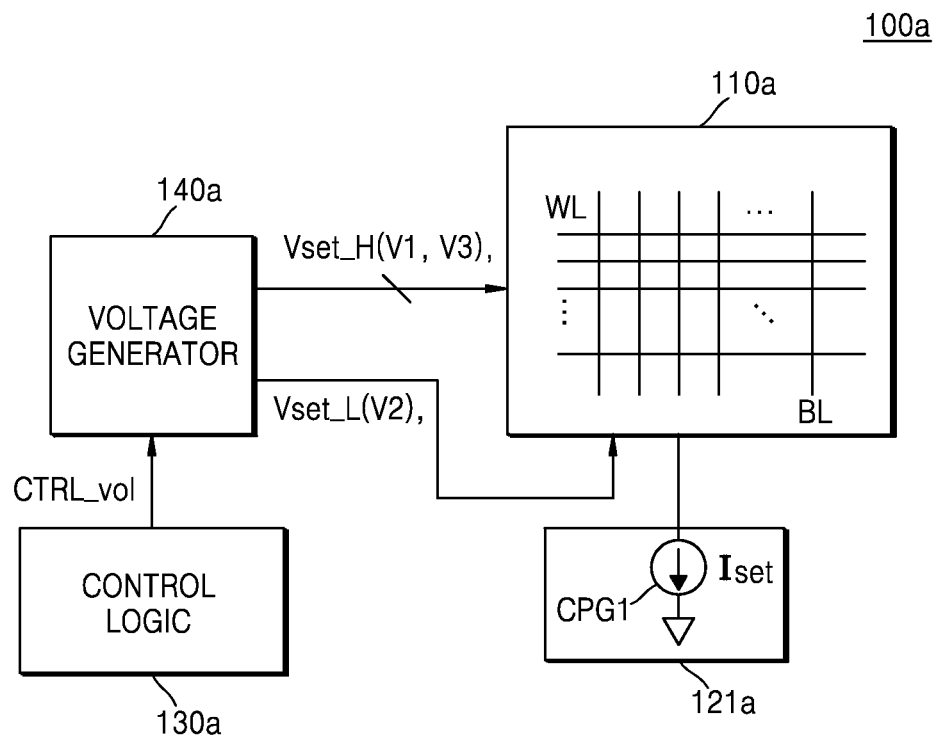
FIG. 8 is a block diagram illustrating a memory device 100a according to another embodiment of the inventive concept.

FIG. 8 is a block diagram illustrating a memory device 100a according to another embodiment of the inventive concept. The memory device 100a, generally similar to the memory device 100 of FIG. 1, includes a memory array 110a which is further illustrated in one operative example in FIG. 9. The memory device 100a also includes control logic 130a and a voltage generator 140a, as well as a read circuit 121a.

Figure 9:
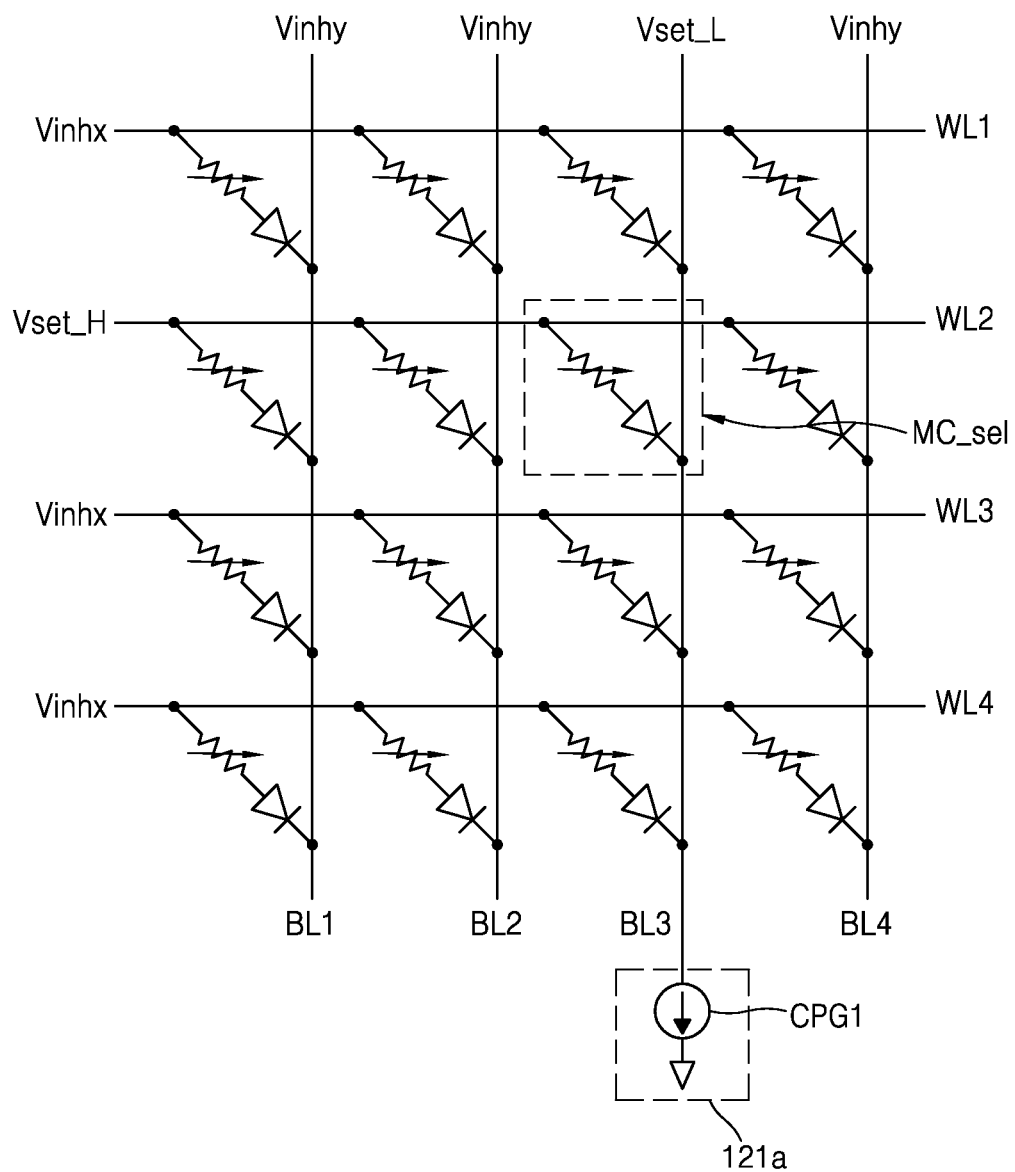
FIG. 9 is another partial circuit diagram conceptually illustrating the application of voltage and current to a selected memory cell during a set write operation.

Referring to FIGS. 8 and 9, the memory cell array 110a includes a plurality of word lines WL and a plurality of bit lines BL, and a plurality of memory cells MC arranged on regions where the plurality of word lines WL and the plurality of bit lines BL cross each other. A forward-biasing voltage is applied to a selected memory cell MC_sel from among the plurality of memory cells MC, and a current pulse is applied to the selected memory cell during a set write operation.

As shown in FIG. 9, the selected memory cell MC_sel receives a voltage via a word line WL2 and a bit line BL3 connected thereto. Hereinafter, the word line WL and the bit line BL connected to the selected memory cell MC_sel will be referred to as a "selected word line" and a "selected bit line".

Under these conditions, a voltage corresponding to a potential difference between the set high voltage Vset_H applied to the selected word line WL2 and the set low voltage Vset_L applied to the selected bit line BL3 is applied across opposite terminals of the selected memory cell MC_sel. In addition, in order to prevent a large amount of leakage current from occurring in unselected memory cells MC, a row inhibit voltage Vihnx is applied to unselected word lines WL1, WL3, and WL4, and a column inhibit voltage Vinhy is applied to unselected bit lines BL1, BL2, and BL4.

The voltage generator 140a may be used to generate a plurality of set high voltages Vset_H and at least one set low voltage Vset_L. The set high voltages Vset_H may include a first voltage V1 and a third voltage V3, but is not limited thereto. The voltage generator 140a may generate three or more set high voltages Vset_H. The at least one set low voltage Vset_L may be a second voltage V2. Under these assumptions, the first voltage V1 will have a highest level, the second voltage V2 will have a lowest level, and the third voltage V3 will have a level between those of the first and second voltages V1 and V2. In certain embodiments, the second voltage V2 may be a ground voltage.

The write circuit 121a includes a current source CPG1, and may be connected to the selected word line WL or the selected bit line BL to supply the write current Iset to the selected memory cell MC_sel. The current source CPG1 is connected to the bit line BL or the word line WL connected to the selected memory cell MC_sel so as to force or 'sink' the set write current Iset via the bit line BL or the word line WL. Accordingly, the set current flowing through the bit line BL or the word line WL may be restricted to a value corresponding to a current amount of the set write current Iset.

Continuing with the working example, the first voltage V1 is applied to the selected word line WL2 and the second voltage V2 is applied to the selected bit line BL3, and thus, a pre-write voltage pulse is applied to the selected memory cell MC_sel. After a corresponding write begin time has elapsed, the third (intermediate level) voltage V3 is applied to the selected word line WL2, and thus, the level of the voltage applied to the selected memory cell MC_sel is decreased.

Further, the current source CPG1 of the write circuit 121a is connected to the selected bit line BL3. Accordingly, an amount of the current flowing through the selected bit line BL3 is restricted to the current amount of the set write current Iset, and the cell current corresponding to the current amount of the set write current Iset may flow through the selected memory cell MC_sel. Here, as described above with reference to FIG. 7, the resistance value of the selected memory cell may be determined based on the amount of current flowing through the selected memory cell. Therefore, the amount of set write current Iset may be adjusted such that the selected memory cell MC_sel exhibits a resistance state corresponding to the value of the data being written.

In the foregoing example, the control logic 130a may be used to determine the respective levels of the first, second and third voltages V1, V2, and V3 in response to one or more operational and/or environmental conditions in relation to the execution of a set write operation. In this regard, control logic 130a may control the timing by which the set high voltage Vset_H that is initially applied to the selected word line WL2 transitions from the first voltage V1 to the third voltage V3, as well as the speed with which the transition (e.g., switching) from the first voltage V1 to the third voltage V3 happens.

Figure 10A:
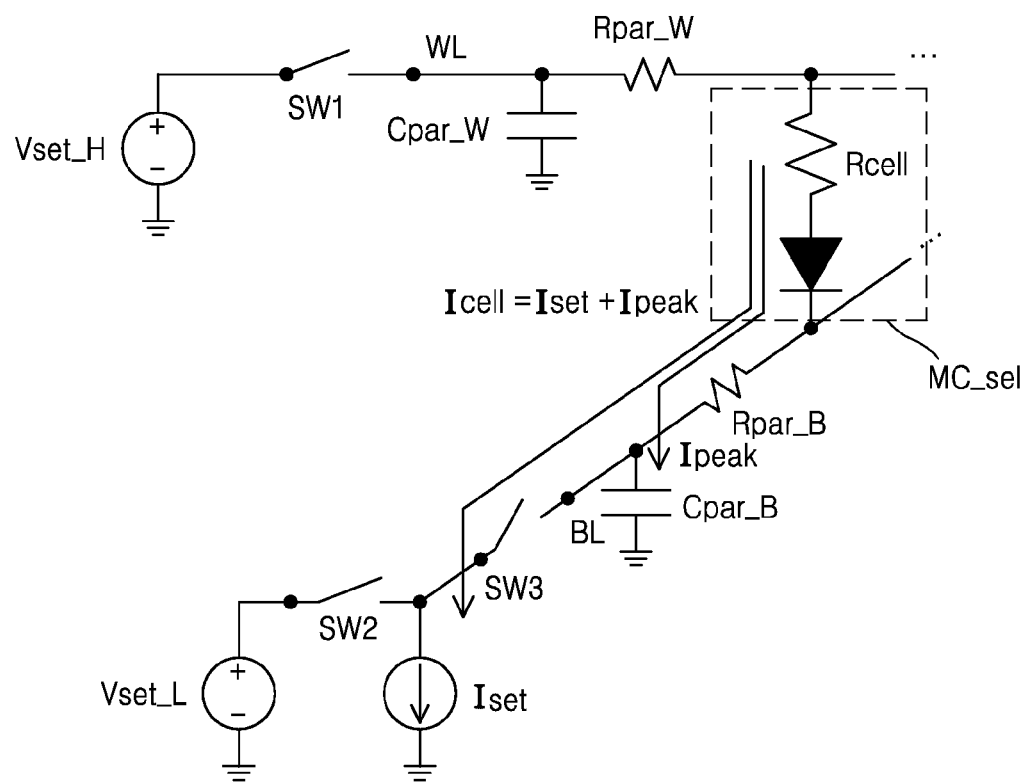
FIG. 10A is a circuit diagram illustrating a set write operation when a surge current flows through a memory cell.
Figure 10B:
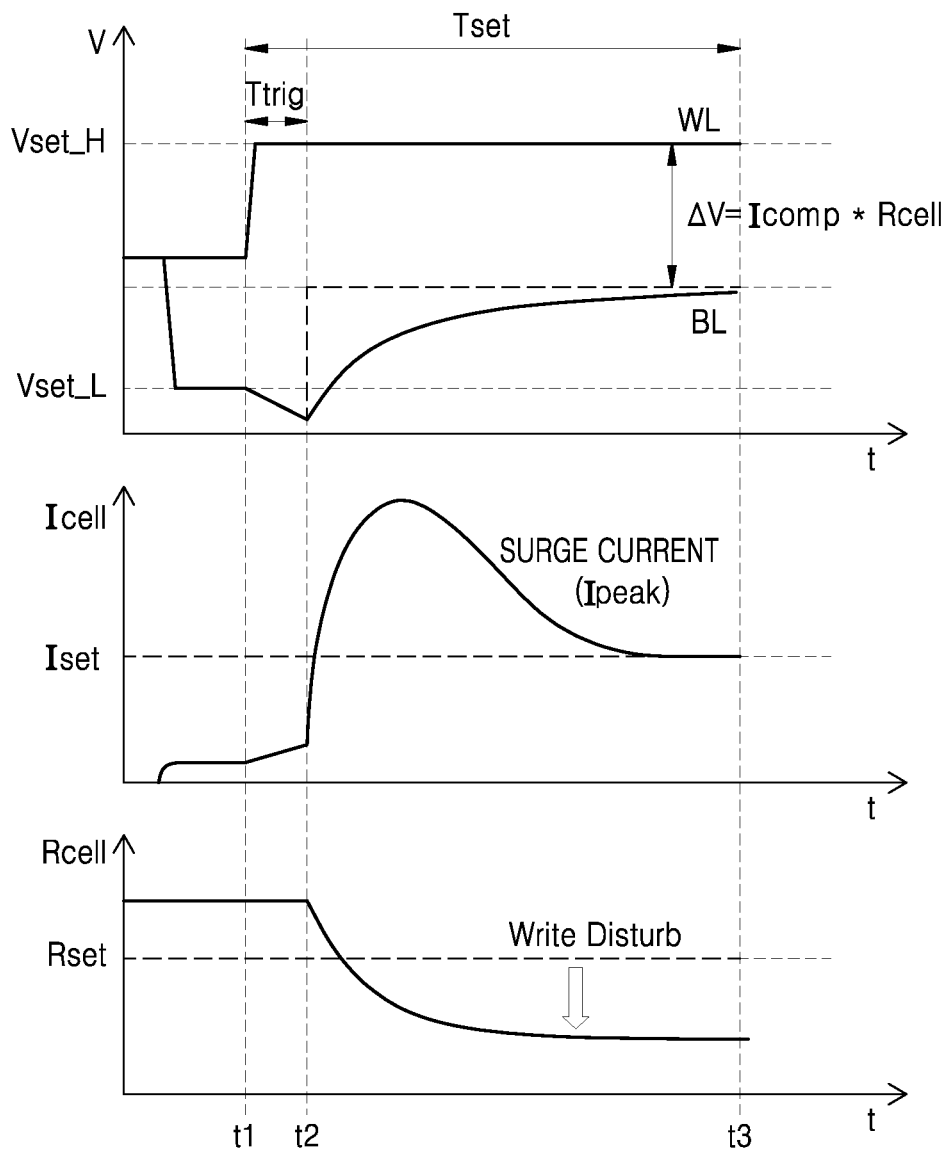
FIG. 10B is a graph illustrating relationships between memory cell voltage, current, and resistance state as the surge current of FIG. 10A flows through the memory cell.

FIG. 10A is a circuit diagram conceptually illustrating a set writing process when a surge current flows through a selected memory cell. FIG. 10B is a graph illustrating relationships between voltage, current, and resistance state for the selected memory cell MC_sel under these conditions.

Referring to FIG. 10A, the selected memory cell MC_sel is connected to the word line WL and the bit line BL, where the word line WL and bit line BL are assumed to have respective parasitic capacitors Cpar_W and Cpar_B providing parasitic resistances Rpar_W and Rpar_B.

The set high voltage Vset_H, set low voltage Vset_L, and set write current Iset are respectively applied to the selected word line WL and selected bit line BL in response to the turning ON/OFF of switches SW1, SW2, and SW3. Here, the switches SW1, SW2, and SW3 may be assumed to be functional products of the row decoder 150 and column decoder 160, where the turning ON/OFF of the various switches is controlled by the control logic 130a.

Referring to FIG. 10B, at the start of a set writing interval (Tset), for example, at a time t1, the set high voltage Vset_H is applied to the word line WL and the set low voltage Vset_L is applied to the bit line BL to create a forward-biased condition. Then, the set write current Iset is applied to the bit line BL. Since the resulting voltage level of the bit line BL is lower than that of the word line WL, the set write current Iset sinks through the bit line BL.

After a predetermined triggering time, that is, at time t2, the resistance state of the memory cell MC_sel is changed, and the cell current Icell flowing through the selected memory cell MC_sel begin to increase quite notably. The voltage level between the opposite terminals of the selected memory cell MC_sel decreases, and accordingly, the level of the bit line voltage increases. It is at this point that the surge current Ipeak (i.e., a current charging the bit line parasitic capacitor Cpar_B begins to flow. Accordingly, the surge current Ipeak may flow through the selected memory cell MC_sel in addition to the set write current Iset. Since this unexpected high current flows through the selected memory cell MC_sel, the resistance state of the selected memory cell MC_sel (Rcell) may not be properly established in view of a "target set resistance" Rset. Hence, it is possible that a surge current Ipeak associated with signal line parasitic capacitances may be generated, and when generated the excessively high current applied to a selected memory cell during a write operation may result in a writing error, and may also degrade the durability of the memory cell.

Figure 11A:
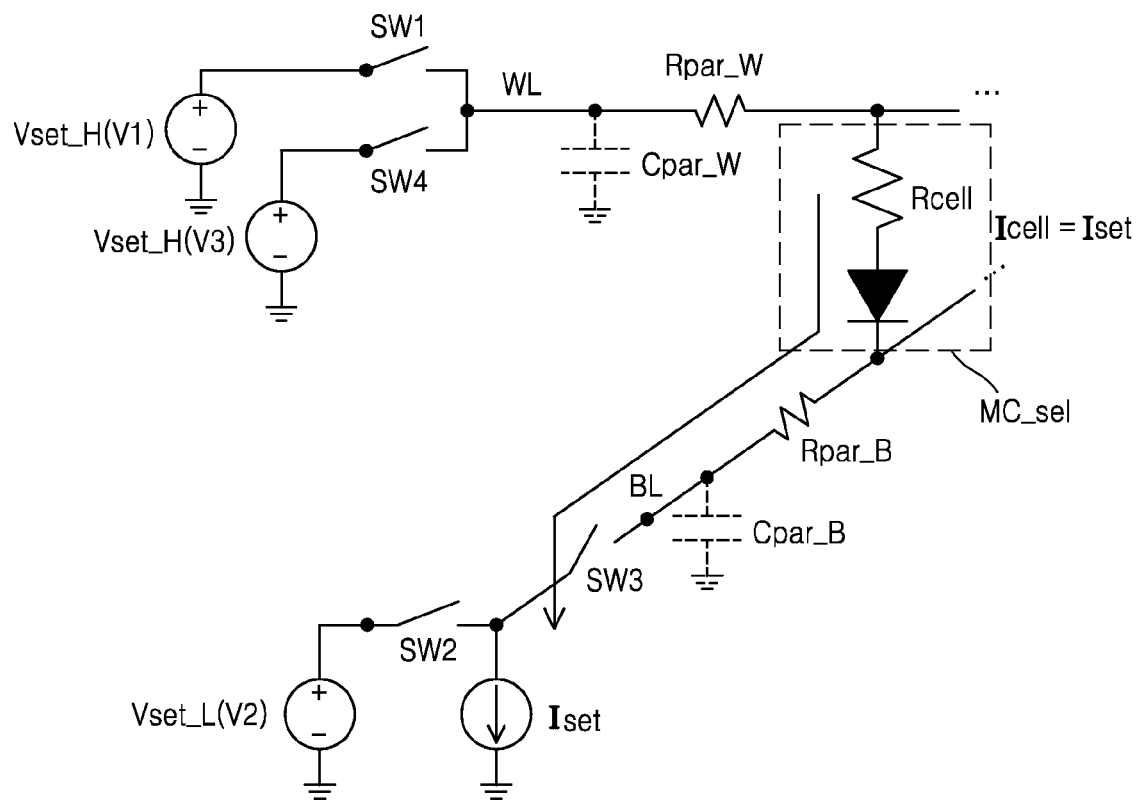
FIG. 11A is a circuit diagram illustrating a set write operation according to an embodiment of the inventive concept.
Figure 11B:
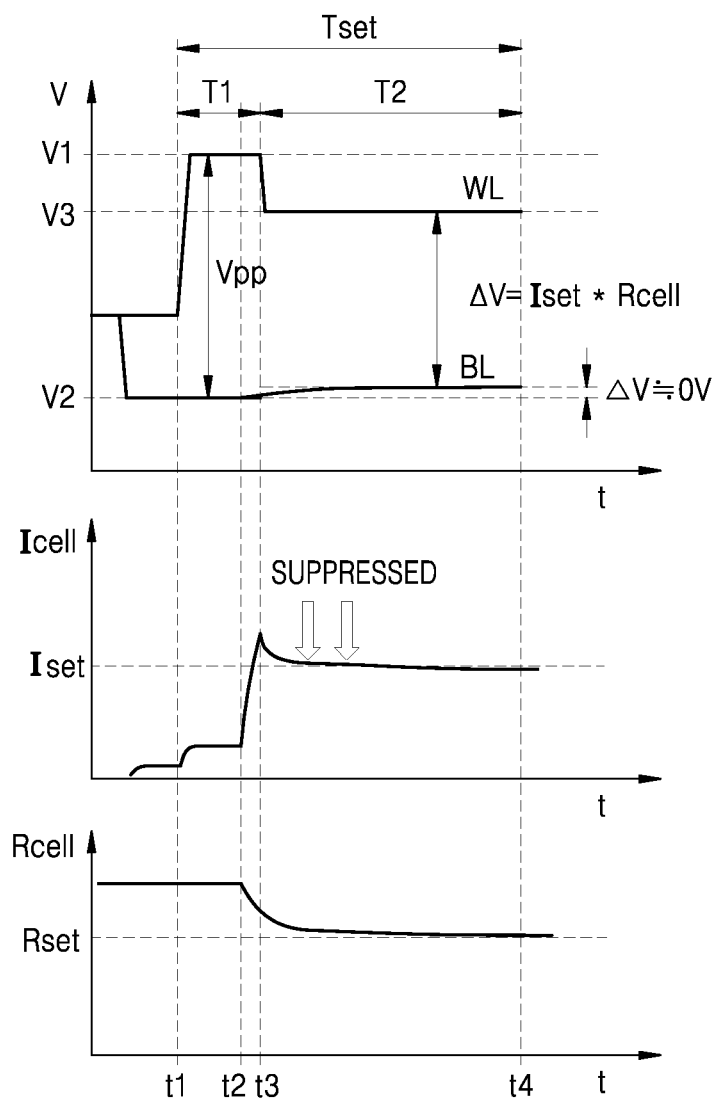
FIG. 11B is a graph illustrating memory cell current and resistance state when a set write operation according to the embodiment is performed.

FIG. 11A is a circuit diagram conceptually illustrating a set writing method according to an embodiment of the inventive concept. FIG. 11B is a graph illustrating relationships between voltage, current and resistance state for a selected memory cell when a set writing method consistent with certain embodiments of the inventive concept is executed.

Referring to FIG. 11A, as before with the example of FIG. 10A, the set high voltage Vset_H, set low voltage Vset_L, and set write current Iset are respectively applied to the word line WL and the bit line BL connected to a selected memory cell MC_sel in accordance with the turning ON/OFF of switches SW1, SW2, SW3, and SW4 by the control logic 130, row decoder 150 and/or column decoder 160. Again, the set high voltage Vset_H is assumed to be the first voltage V1 selected from the previously described group of voltages also including the second voltage V2 and third voltage V3, and the set low voltage Vset_L is assumed to be the second voltage V2.

Referring to FIG. 11B, the set writing interval Tset includes a first set writing interval T1 and a second set writing interval T2, where during the first set writing interval T1, a pre-write voltage pulse Vpp is applied to the selected memory cell MC_sel to trigger the change in the cell resistance Rcell.

As shown in FIG. 11B, the first voltage V1 may be applied to the word line WL and the second voltage V2 may be applied to the bit line BL during the first set writing section T1. For example, the pre-write voltage pulse Vpp may be applied to the selected memory cell MC_sel at time t1, assuming that at least one of the first and second voltages V1 and V2 is respectively applied to the word line WL or the bit line BL before time t1. Under this condition, the selected memory cell MC_sel is forward biased. Then, the set write current Iset may be applied to the bit line BL and sunk through the bit line BL.

After a predetermined write begin time (e.g., after time t2), the cell resistance Rcell has begun to change to change its resistance state, and the cell current Icell increases accordingly. However, within a predetermined time period after the cell resistance Rcell begins to change (e.g., a time t3), the third voltage V3 may be applied to the word line WL in place of the first voltage V1, so as to reduce the voltage applied to the selected memory cell MC_sel. In this regard, the change in the cell resistance Rcell state may be sensed in relation to the current amount flowing through the second signal line (e.g., the word line WL), whereupon time t3 may be determined.

As described above, the development of a surge current due to the parasitic capacitor Cpar_B of the bit line BL may be prevented by reducing the voltage applied to the selected memory cell MC_sel once the cell resistance Rcell begins to change. The cell current Icell may be maintained at the set write current Iset. During the second set writing interval T2, the voltage applied to the word line WL is maintained at the third voltage V3 and the voltage applied to the bit line BL is maintained at the second voltage V2, and when the set write current Iset is adjusted, the cell resistance Rcell may be switched to the target set resistance Rset. In the embodiment illustrated in FIG. 11B, the second set writing interval T2 is longer than the first set writing interval T1.

Figure 12:
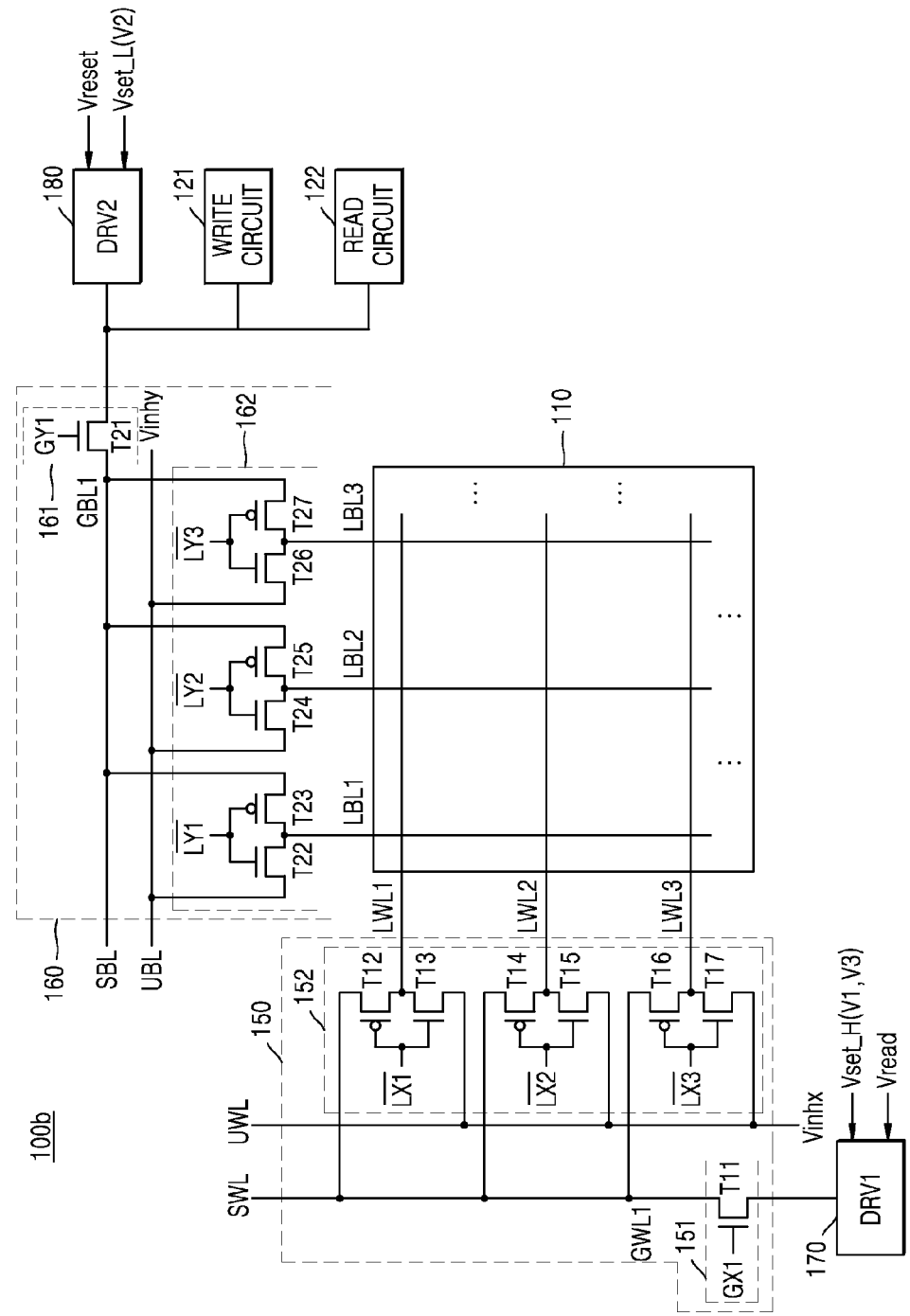
FIG. 12 is a circuit diagram illustrating a memory device including the memory cell array of FIGS. 8 and 9, as well as the write circuit 120 of FIG. 2.

FIG. 12 is a circuit diagram illustrating a memory device 100b including the memory cell array 110 and the write circuit 121 of FIGS. 8 and 9.

Referring to FIG. 12, the memory device 100b includes the memory cell array 110, the write circuit 121, the read circuit 122, the row decoder 150, the column decoder 160, and first and second drivers 170 and 180. The memory device 100b is a modified example of the memory device 100 of FIG. 2.

The row decoder 150 may include a first row decoder 151 and a second row decoder 152. The first row decoder 151 may activate a first global word line GWL1 in response to a first global row address GX1. The first row decoder 151 may include a transistor T11, and may be referred to as a global row switch. For example, if the global row address GX1 is '1', the first row decoder 151 may connect the first global word line GWL1 to the first driver 170.

The second row decoder 152 may activate first, second and third local word lines LWL1, LWL2, and LWL3 in response to first to third local row addresses LX1, LX2, and LX3. The first, second and third local word lines LWL1, LWL2, and LWL3 may correspond to the word lines WL1, WL2, and WL3 of FIG. 2. The second row decoder 152 may include transistors T12 to T17, and may be referred to as a local row switch. For example, if the local row address LX1 is '1', the transistor T12 is turned ON and the transistor T13 is turned OFF. As such, the first local word line LWL1 becomes a selected word line SWL and is connected to the first driver 170. In addition, if the local row address LX1 is '0', the transistor T12 is turned OFF and the transistor T13 is turned ON. As such, the first local word line LWL1 is an unselected word line UWL and may receive a row inhibit voltage Vinhx.

The first driver 170 may receive the first voltage V1 and the third voltage V3 as the set high voltage Vset_H. Also, the first driver 170 may receive a read voltage Vread. The first driver 170 may selectively apply the first voltage V1, the third voltage V3, or the read voltage Vread to the first global word line GWL1 according to an operating status of the memory device 100b. When the memory device 100b is in the set write operation mode, the first driver 170 may sequentially apply the first and third voltages V1 and V3 to the first global word line GW1.

The column decoder 160 may include a first column decoder 161 and a second column decoder 162. The first column decoder 161 may activate a first global bit line GBL1 in response to a first global column address GY1. The first column decoder 161 may include a transistor T21, and may be referred to as a global column switch. For example, if the global column address GY1 is '1', the first column decoder 161 may connect the first global bit line GBL1 to the second driver 180.

The second column decoder 162 may activate first, second and third local bit lines LBL1, LBL2, and LBL3 in response to first, second and third local column addresses LY1, LY2, and LY3. The first, second and third local bit lines LBL1, LBL2, and LBL3 may correspond to the bit lines BL1, BL2, and BL3 of FIG. 2. The second column decoder 162 may include transistors T21 to T27, and may be referred to as a local column switch. For example, if the local column address LY1 is '1', the transistor T22 is turned ON and the transistor T23 is turned OFF. As such, the first local bit line LBL1 becomes a selected bit line SBL and is connected to the second driver 180. In addition, if the local column address LY1 is '0', the transistor T22 is turned OFF and the transistor T23 is turned ON. As such, the first local bit line LBL1 is an unselected bit line UBL and may receive a column inhibit voltage Vinhy.

The second driver 180 may receive the reset voltage Vreset and the set low voltage Vset_L, for example, the second voltage V2. The second driver 180 may selectively apply the second voltage V2 or the reset voltage Vreset to the first global bit line GBL1, and may apply the second voltage V2 to the first global bit line GBL1 when the memory device 100b is in the set writing mode.

In addition, the write circuit 121 may include a current source, and may be connected to the first global bit line GBL1 to supply the set write current to the first global bit line GBL1 when the memory device 100b is in the set writing mode.

Figure 13:
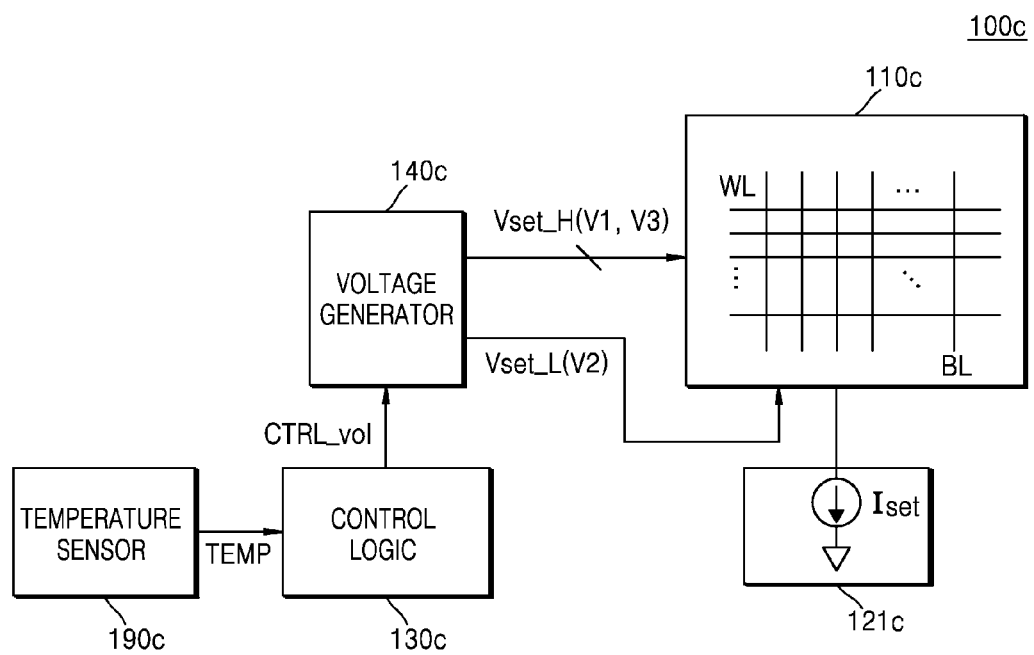
FIG. 13 is a block diagram of a memory device according to still another embodiment of the inventive concept.

FIG. 13 is a block diagram illustrating a memory device 100c according to another embodiment of the inventive concept.

Referring to FIG. 13, the memory device 100c includes a memory cell array 110c, a write circuit 121c, a control logic 130c, a voltage generator 140c, and a temperature sensor 190c. The memory device 100c is another modified example of the memory device 100 of FIG. 2. Therefore, the operation of the memory cell array 110c, write circuit 121c, and voltage generator 140c are substantially similar to those of the memory cell array 110a, write circuit 121a, and voltage generator 140a of FIG. 8.

The temperature sensor 190c detects a temperature in the memory device 100c, and generates a temperature detection signal TEMP. The temperature detection signal TEMP is provided to the control logic 130c, such that the control logic 130c may control the execution of a write operation directed to the memory cell array 110c in response to changes in the operating temperature of the memory device 100c.

In addition, the control logic 130c may control the definition and application of certain control signals (e.g., level, application timing and/or slew rate of a pre-write voltage pulse, level(s) of voltages configuring the pre-write voltage pulse, etc.) according to actual operating state and conditions of the memory device 100c. In this manner, the control logic 130c may control the execution of a write operation in response to temperature variation and/or the location of a selected memory cell within the memory cell array 110c.

Examples of this type of control over the execution of write operations are described hereafter in relation to FIGS. 14A, 14B, 14C, 15, 16A, 16B, 16C, 17A to 17B.

Figure 14A:
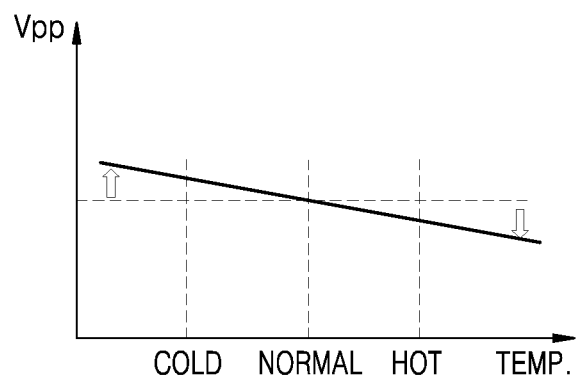
FIG. 14A is a graph illustrating an example of adjusting a pulse magnitude for a pre-write voltage pulse.
Figure 14B:
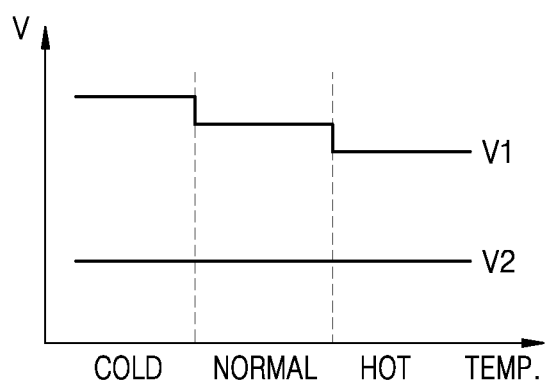
FIGS. 14B and 14C are graphs respectively illustrating examples that change voltage levels during the configuration of the pre-write voltage pulse as a function of temperature.
Figure 14C:
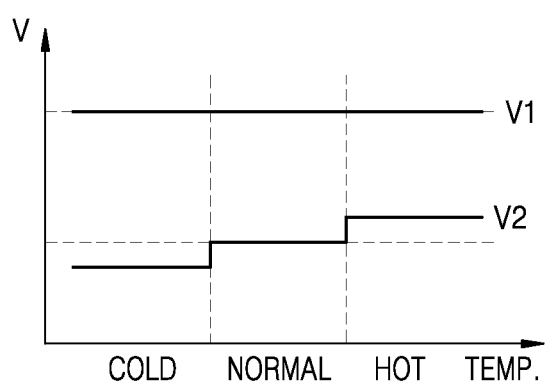

FIG. 14A is a graph showing adjustment in the level of a pre-write voltage pulse in response to temperature variation. FIGS. 14B and 14C are respective graphs showing examples of changing voltages configuring the pre-write voltage pulse in response to temperature variation.

Referring to FIG. 14A, the level and/or pulse width of a pre-write voltage pulse Vpp may be adjusted in response to temperature variation of the memory device 100c. For example, the level of the pre-write voltage pulse may be increased at low temperatures, and decreased at high temperatures relative to a nominal or 'normal' temperature range. Alternately or additionally, the nominal width of the pre-write voltage pulse Vpp may be increased or decreased in response to temperature variation.

For example, referring to FIGS. 14B and 14C, the first voltage V1 or the second voltage V2 may increase or decrease non-linearly according to predetermined temperature ranges. Referring to FIG. 14B, the first voltage V1 is decreased in a high temperature range so as to decrease the pulse width of the pre-write voltage pulse Vpp. Also, referring to FIG. 14C, the second voltage V2 is increased in the high temperature range, so as to decrease the pulse width of the pre-write voltage pulse Vpp. In this context, changes in the level of the first voltage V1 and second voltage V2 may be singularly or simultaneously applied in order to specifically define the nature of the pre-write voltage pulse Vpp.

Figure 15:
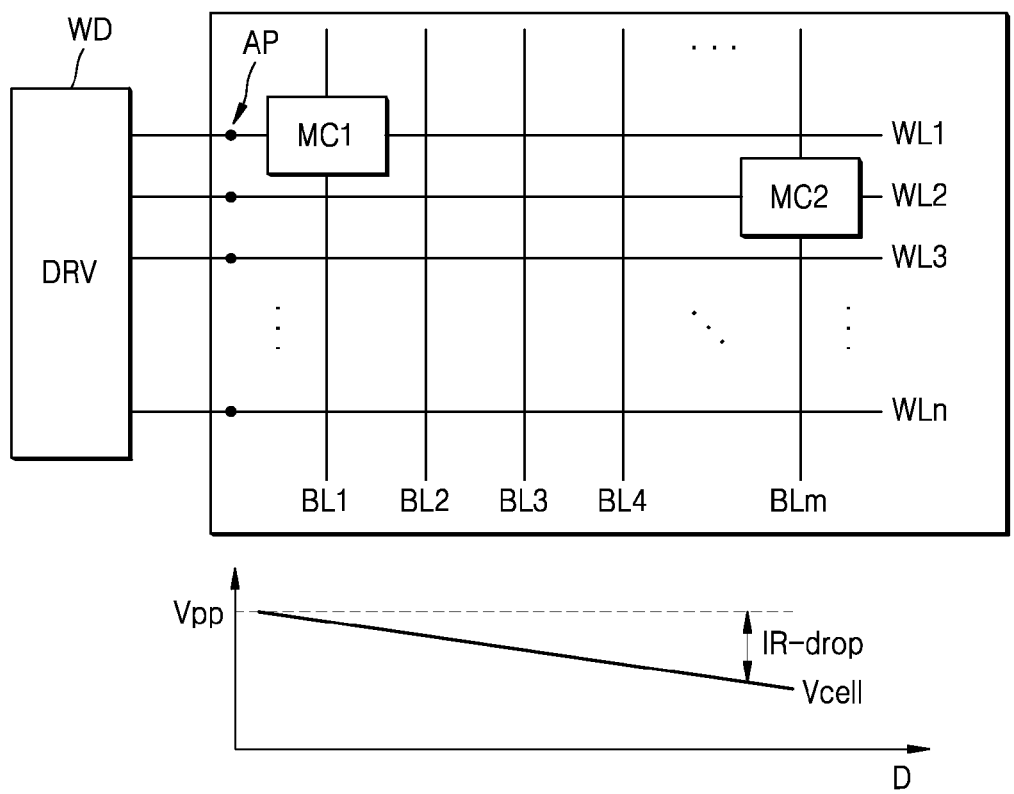
FIG. 15 is a conceptual diagram illustrating an expected voltage drop along the length of a memory cell array signal line (e.g., word line or bit line)
Figure 16A:
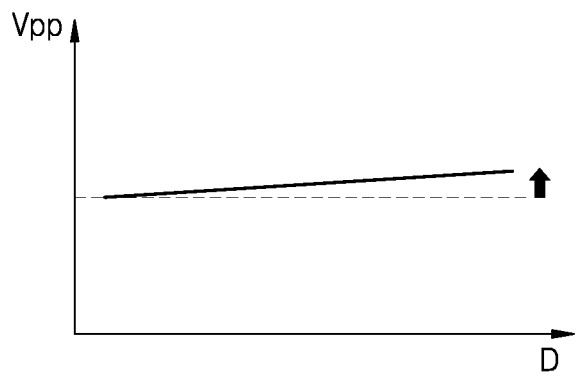
FIG. 16A is a graph illustrating an example wherein the pulse of a pre-write voltage pulse varies in accordance with the location of a selected memory cell with a memory cell array according to certain embodiments of the inventive concept.
Figure 16B:
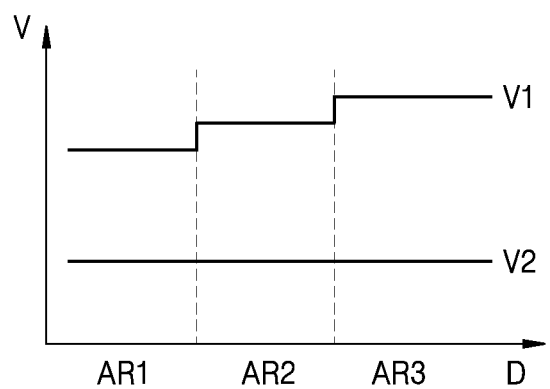
FIGS. 16B and 16C are graphs illustrating examples of voltage levels being changed during the configuration of a pre-write voltage pulse as a function of selected memory cell location according to an embodiment of the inventive concept.
Figure 16C:
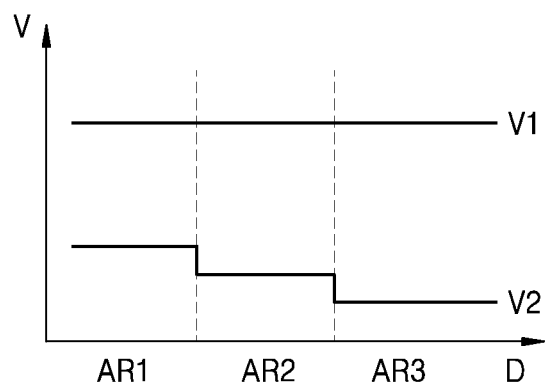

FIG. 15 is a diagram illustrating a memory cell voltage (Vcell) drop as a function of memory cell location along a signal line extending across a memory cell array. In FIG. 15, a write driver WD (e.g., the first driver 170 of the row decoder 150 of FIG. 12) is assumed to apply a voltage to one or more selected word lines WL1 to WLn. FIG. 16A is a graph illustrating an example wherein the pulse width of a pre-write voltage pulse is adjusted. FIGS. 16B and 16C are respective graphs illustrating examples of changing voltages in the pre-write voltage pulse according to a location of the selected memory cell.

Referring to FIG. 15, the write driver WD may apply the voltage to at least one point on the word lines WL1 to WLn. The at least one point is referred to as an access point AP. When performing the set write operation, the set current flows through the selected memory cell, and accordingly, current flows via the word lines WL1 to WLn and the bit lines BL1 to BLm. Since there are parasitic resistances in the word lines WL1 to WLn and the bit lines BL1 to BLm, a voltage dropping (i.e., IR-drop) caused by the parasitic resistance occurs. The voltage dropping associated with individual memory cells is greater as the memory cell is more distant from the access point AP. For example, when the set high voltage is applied to the access point AP, the voltage level of the set high voltage applied to the second memory cell MC2 will be lower than the voltage level of the set high voltage applied to the first memory cell MC1. Accordingly, the pulse width of the pre-write voltage pulse Vpp applied to the second memory cell MC2 may be less than the pulse width of the pre-write voltage pulse Vpp applied to the first memory cell MC1.

According to the embodiment illustrated in FIG. 16A, when the memory cell to which a write operation is directed is farther from the access point AP, the pulse width of the pre-write voltage pulse Vpp applied to the memory cell may be increased. For example, as shown in FIGS. 16B and 16C, the memory cell array may be divided into a plurality of regions AR1, AR2, and AR3 according to respective distances from the access point AP. Then, the voltage level of the first voltage V1 and/or the second voltage V2 applied to the word line WL or the bit line BL connected to the selected memory cell may be adjusted according to the region from among the plurality of regions AR1, AR2, and AR3 in which the selected memory cell is included when the set write operation is performed on the selected memory cell.

Referring to FIG. 16B, when a selected memory cell is included in a region far from the access point AP, the voltage level of the first voltage V1 applied to the word line may be increased, and/or referring to FIG. 16C, when a selected memory cell is included in a region far from the access point AP, the voltage level of the second voltage V2 applied to the bit line may be decreased.

Figure 17A:
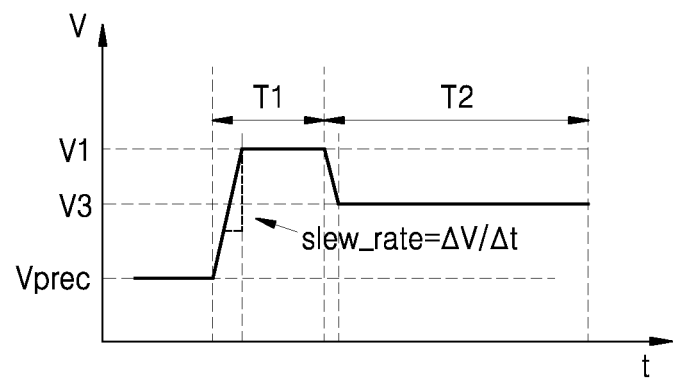
FIGS. 17A and 17B are graphs illustrating adjustment of a through rate of a pre-write voltage pulse according to certain embodiments of the inventive concept.
Figure 17B:
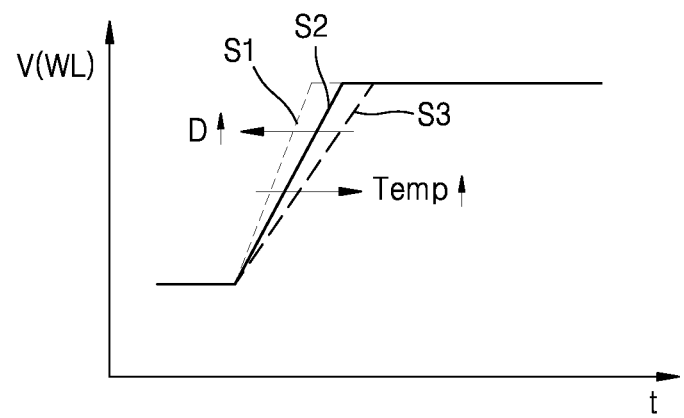

FIGS. 17A and 17B are graphs illustrating examples of adjusting a slew-rate of the pre-write voltage pulse. In FIGS. 17A and 17B the slew rate adjustment of a word line voltage is shown as an example.

The term "slew rate" denotes a variation in voltage over time. As described above with reference to FIG. 11B, the first voltage V1 is applied to the word line in the first set writing interval T1, and the third voltage V3 is applied to the word line in the second set writing interval T2. The second voltage V2 is applied to the bit line and the voltage does not change, and thus, the slew rate of the pre-write voltage pulse Vpp applied to the selected memory cell may be substantially equal to the voltage variation in the word line.

Referring to FIG. 17A, when the first voltage V1 or the third voltage V3 is applied to the word line, the variation in the voltage level of the word line has a particular slope with respect to time. This slope is referred to as the slew rate.

Referring to FIG. 17B, the slew rate of the word line may be set as one of a plurality of slew rates S1, S2, and S3. When the slew rate is set as the first slew rate S1, the voltage changing speed is the fastest, and when the slew rate is set as the third slew rate S3, the voltage changing speed is the slowest.

According to the embodiment, the slew rate of the word line may be adjusted based on the temperature variation and the physical location of the memory cell on which the write operation is performed.

As shown in FIG. 17B, the slew rate of the word line may be set to be low when the temperature is high, and may be set to be high when the selected memory cell is far from the access point of the word line, to which the voltage is applied. In addition, a rising slew rate and a falling slew rate may be set independently from each other. For example, the slew rate when the voltage of the word line increases from a previous voltage level Vprec to the voltage level of the first voltage V1 and the slew rate when the voltage of the word line decreases from the level of the first voltage V1 to the level of the third voltage V3 may be different from each other.

Figure 18:
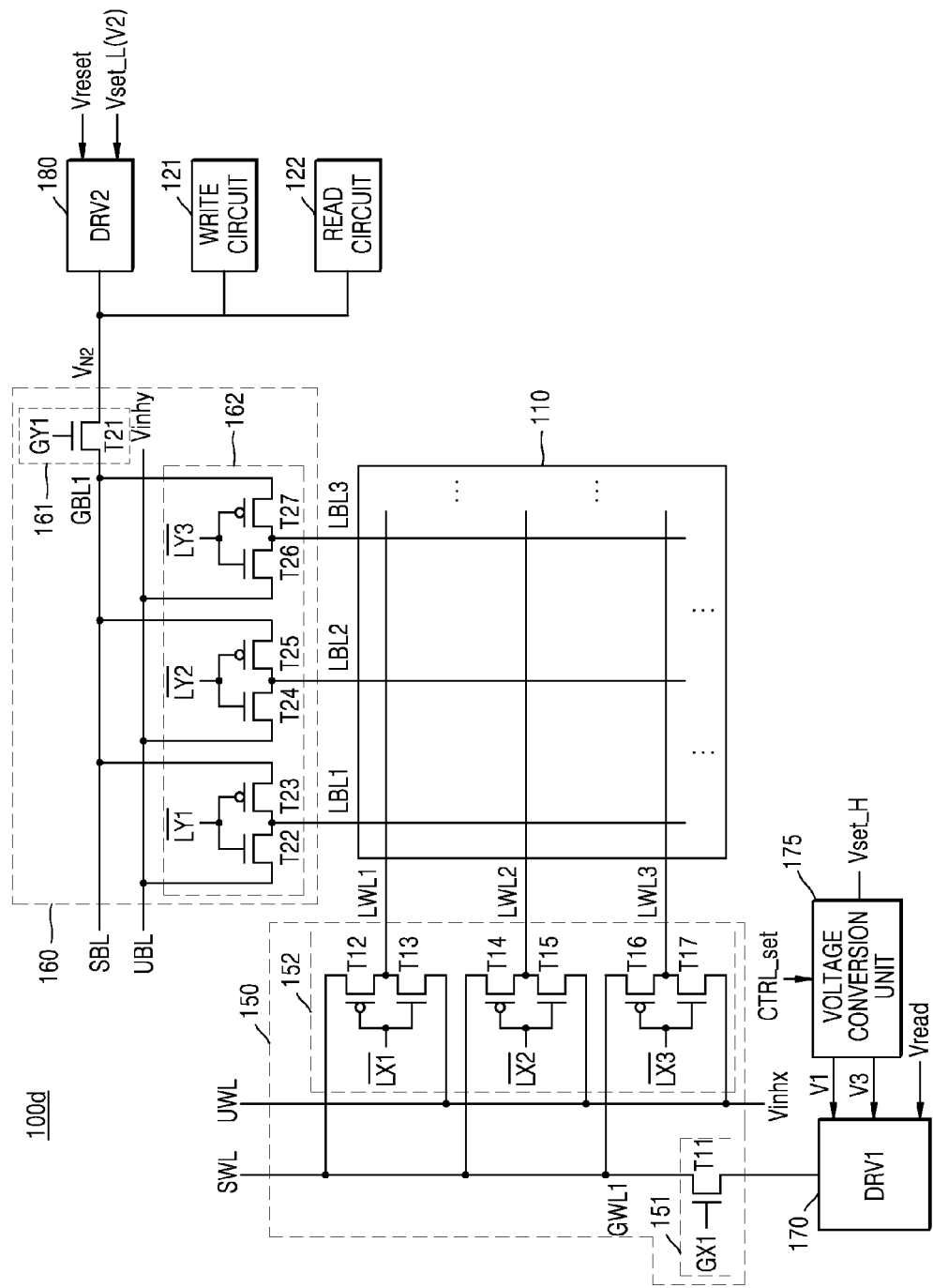
FIG. 18 is a circuit diagram of a memory device according to an embodiment of the inventive concept.

FIG. 18 is a circuit diagram illustrating a memory device 100d according to another embodiment of the inventive concept.

Referring to FIG. 18, the memory device 100d includes the memory cell array, the write circuit 121, the read circuit 122, the row decoder 150, the column decoder 160, the first and second drivers 170 and 180, and a voltage conversion unit 175.

When comparing the memory device 100d of FIG. 18 with the memory device 100b of FIG. 12, the memory device 100d further includes the voltage conversion unit 175. The voltage conversion unit 175 receives the set high voltage Vset_H, and converts and outputs the voltage based on the set control signal CTRL_set. The set control signal CTRL_set may be transmitted from the control logic 130. (See FIG. 2). For example, the voltage conversion unit 175 receives the first voltage V1, and outputs the first voltage V1 to the first driver 170 in the first set writing interval and generates the third voltage V3 having the lower voltage level than that of the first voltage V1 based on the first voltage V1 in the second set writing interval and provides the third voltage V3 to the first driver 170.

In one embodiment, the voltage conversion unit 175 may be a part of the first driver 170. According to another embodiment, the voltage conversion unit 175 may be a part of the voltage generator (140 of FIG. 2).

Figure 19A:
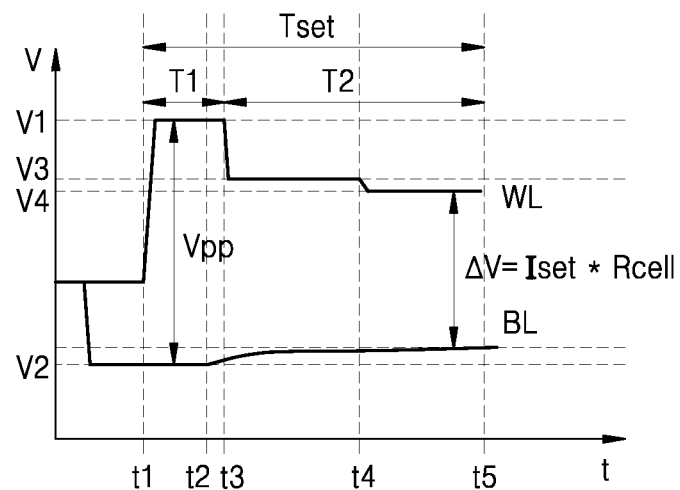
FIGS. 19A and 19B are graphs illustrating set writing methods according to certain embodiments of the inventive concept.
Figure 19B:
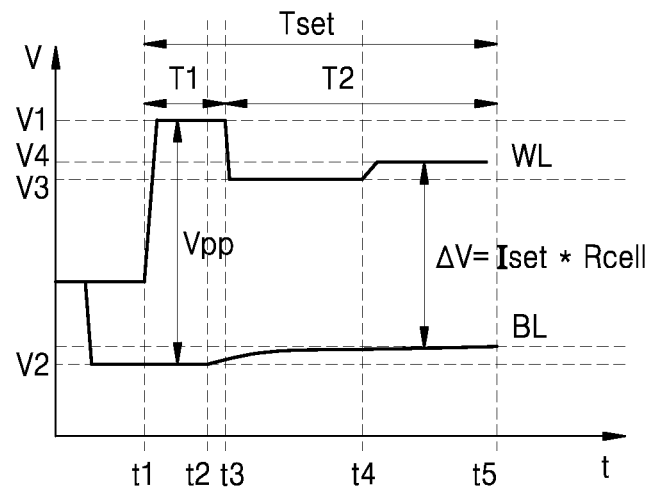

FIGS. 19A and 19B are graphs illustrating set writing methods according to one or more embodiments of the inventive concept.

Referring to FIGS. 19A and 19B, after applying the third voltage V3 to the word line WL in the second set writing interval T2, a fourth voltage V4 may be applied to the word line WL at a time point t4. The fourth voltage V4 may be approximate to the third voltage V3.

As shown in FIG. 19A, the fourth voltage V4 may be lower than the third voltage V3 and greater than the second voltage V2. Also, as shown in FIG. 19B, the fourth voltage V4 may be lower than the first voltage V1 and greater than the third voltage V3.

By adjusting the voltage applied to the word line WL, the cell resistance Rcell may be adjusted accurately.

Figure 20:
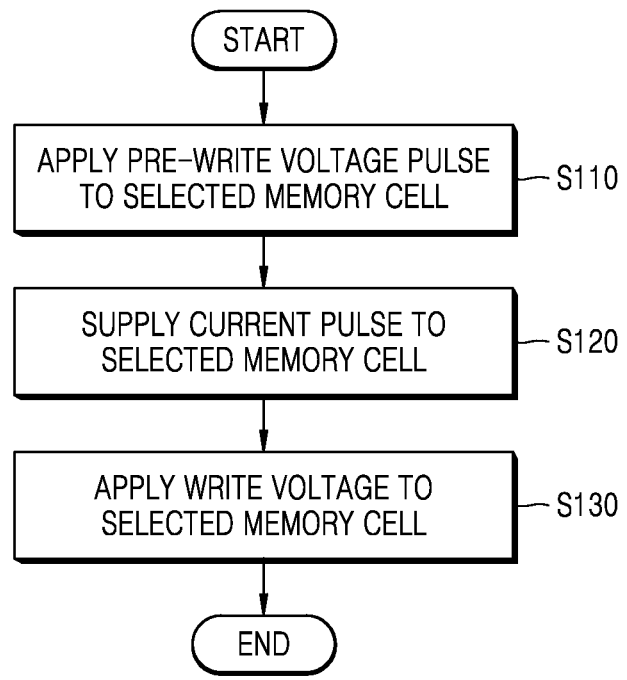
FIG. 20 is a flowchart generally summarizing a method of operating a memory device according to embodiments of the inventive concept.

FIG. 20 is a general flowchart summarising a method of operating the memory device according to an embodiment of the inventive concept.

Referring to FIG. 20, the method of operating the memory device according to the present embodiment is a method of performing a write operation on selected memory cells included in the memory cell array of the memory device. The descriptions provided above with reference to the foregoing embodiments may be applied to the method of operating the memory device according to the present embodiment.

In the operating method, a pre-write voltage pulse is applied to a selected memory cell (S110). The pre-write voltage pulse will have a level (or magnitude) to trigger a change in the resistance of the memory cell.

A current pulse is also supplied to the selected memory cell (S120). The current pulse may be the set write current. The current pulse may be supplied by connecting the current source to the bit line or the word line that is connected to the selected memory cell. Here, supplying of the current pulse may denote sinking or forcing of the current. In one embodiment, the current source may be connected to a signal line, to which the higher voltage is applied between the word line and the bit line, for forcing the set write current. In another embodiment, the current source may be connected to one of the word line and the bit line, to which the lower voltage is applied, for sinking the set write current.

Then, a write voltage is applied to the selected memory cell (S130). The write voltage may be the set write voltage, and has a magnitude that is less than the pulse magnitude of the pre-write voltage pulse. In addition, the current pulse may be applied at the same time of applying the write voltage to the selected memory cell, and the pulse width of the current pulse is adjusted to adjust the cell resistance of the selected memory cell to the target resistance value.

In the foregoing example, operation S110 is performed at the initial stage of the set write operation, that is, in the first set writing interval, and operation S130 may be performed in the second set writing interval after performing operation S110. Operation S120 may be performed in a part of the first set writing interval and in the second set writing interval.

Figure 21:
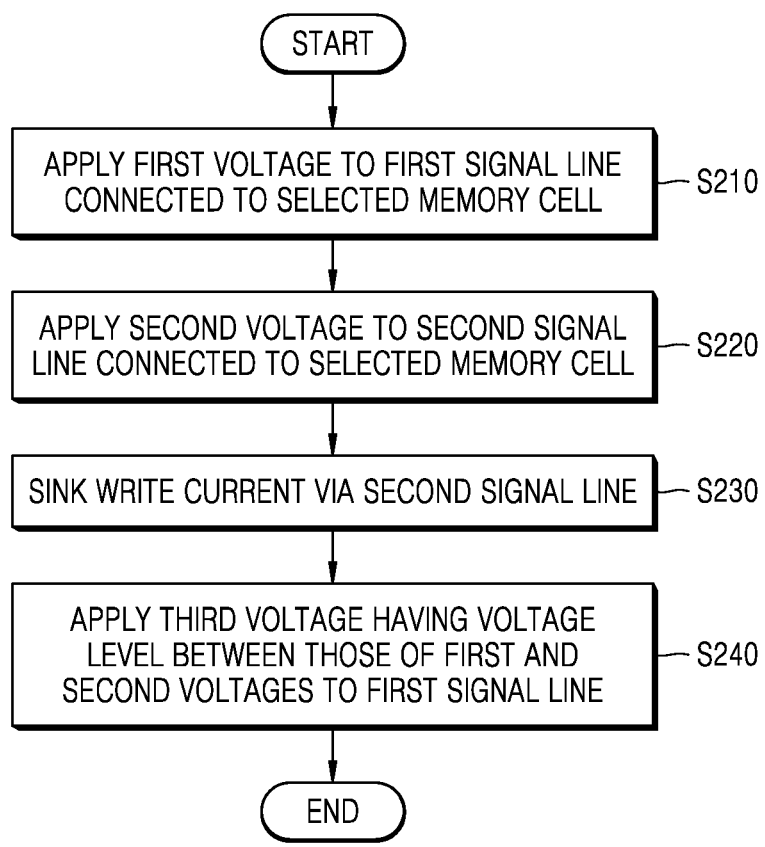
FIG. 21 is a flowchart further illustrating in one example the method of operating a memory device shown in FIG. 20.

FIG. 21 is a flowchart further summarizing the method of operating the memory device described in relation to FIG. 20.

Referring to FIG. 21, first voltage is applied to a first signal line connected to the selected memory cell (S210). The first signal line may be a word line or a bit line. The first voltage may be the set high voltage.

A second voltage is applied to a second signal line connected to the selected memory cell (S220). The first signal line may be a bit line or a word line. The second voltage has a voltage level that is lower than that of the first voltage. By performing operations S210 and S220, the pre-write voltage pulse may be applied to the selected memory cell. As previously noted, operations S210 and S220 may be simultaneously performed, or operation S220 may be performed before or after operation S210 is performed.

The set write current sinks through the second signal line (S230). The second signal line is a signal line to which the relatively lower voltage is applied. The current source may be connected to the second signal line for sinking the set write current.

Then, a third voltage having a level between the levels of the first and second voltages is applied to the first signal line (S240). Accordingly, the write voltage may be applied to the selected memory cell.

In certain embodiments, after performing operation S240, a fourth voltage may be applied to the first signal line for adjusting the voltage level of the write voltage. The fourth voltage is approximate to the third voltage, and may have a level between the levels of the third voltage and second voltage. Otherwise, the fourth voltage may have a level between the levels of the first voltage and third voltage.

Figure 22:
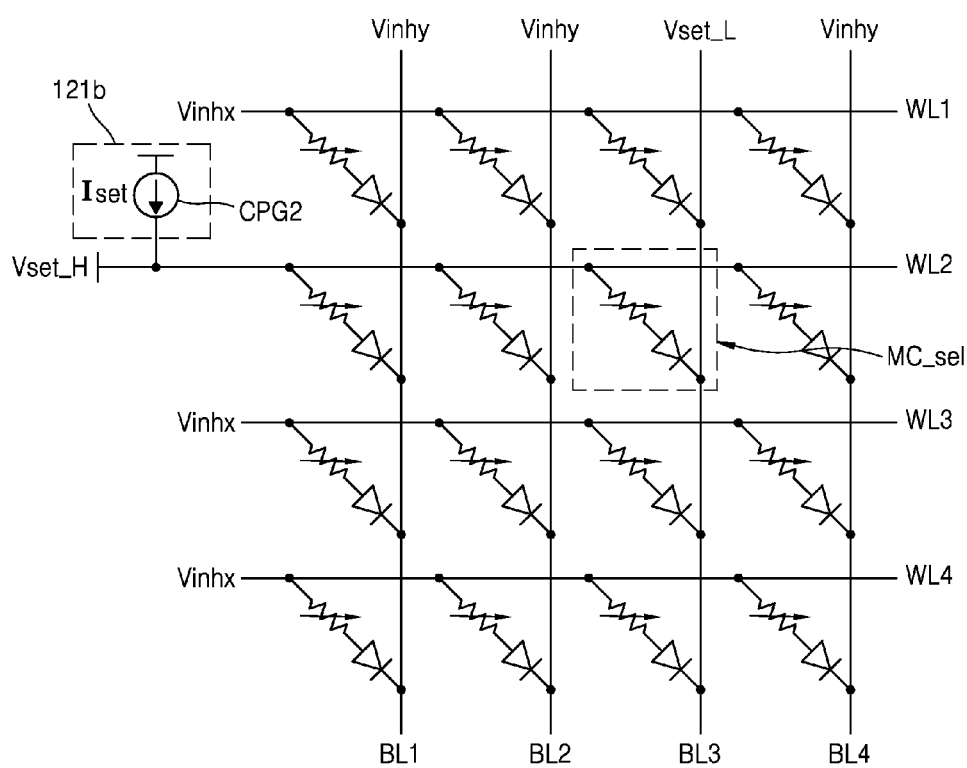
FIG. 22 is a diagram conceptually illustrating the application of voltage and current to a selected memory cell in the memory cell array of FIG. 3 during a set write operation according to an embodiment of the inventive concept.

FIG. 22 is a partial circuit diagram illustrating the application of a voltage and current to a memory cell array when the set write operation is performed in the memory device (e.g., the memory device of FIG. 8) according to an embodiment of the inventive concept.

Referring to FIG. 22, the memory cell array may include a plurality of word lines WL1 to WL4, a plurality of bit lines BL1 to BL4, and a plurality of memory cells arranged on regions where the plurality of word lines WL1 to WL4 and the plurality of bit lines BL1 to BL4 cross each other. A selected memory cell MC_sel is forwardly biased, and a current pulse is applied to perform the set write operation.

The selected memory cell MC_sel may receive the voltage via the word line WL2 and the bit line BL3 connected thereto. Hereinafter, the word line WL2 and the word line BL3 connected to the selected memory cell MC_sel are referred to as a selected word line and a selected bit line.

A voltage corresponding to a potential difference between the set high voltage Vset_H applied to the selected word line WL2 and the set low voltage Vset_L applied to the selected bit line BL3 may be applied to opposite terminals of the selected memory cell MC_sel. Here, voltages having different levels may be applied as the set low voltage Vset_L. The first voltage (V1 of FIG. 8) is applied to the selected word line WL2 and the second voltage (V2 of FIG. 8) is applied to the selected bit line BL3 at the initial stage of the set write operation, and after that, the third voltage V3 having a higher level than that of the second voltage V2 may be applied to the selected bit line BL3. Accordingly, the voltage applied to the opposite terminals of the selected memory cell MC_sel may be lowered than that of the initial stage of the set write operation.

In addition, in order to prevent a large amount of leakage current from occurring in the unselected memory cells, a row inhibit voltage Vinhx may be applied to unselected word lines WL1, WL3, and WL4 and a column inhibit voltage Vinhy may be applied to unselected bit lines BL1, BL2, and BL4.

The write circuit 121b includes a current source CPG2 that may be connected to the selected word line WL2 to apply the write current Iset to the selected memory cell MC_sel. The current source CPG2 may be connected to the selected word line WL2 for forcing the set write current Iset via the selected word line WL2. Accordingly, the current flowing through the selected word line WL2 may be restricted to a value corresponding to the current amount of the set write current Iset.

Figure 23:
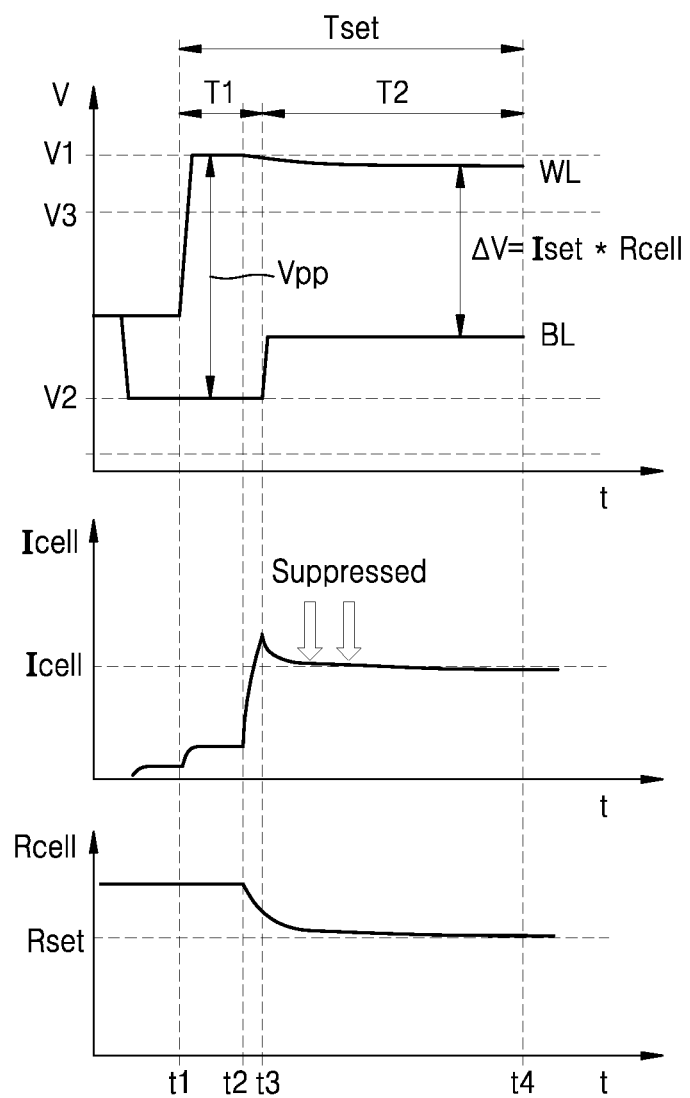
FIG. 23 is a graph illustrating relationships between voltage, current, and resistance state for the memory device of FIG. 22 during a set write operation.

FIG. 23 is a graph illustrating relationships between voltage, current, and resistance variations according to the set write operation performed in the memory device of FIG. 22.

Referring to FIG. 23, the set writing interval Tset may include a first set writing interval T1 and a second set writing interval T2. The pre-write voltage pulse Vpp may be applied to the selected memory cell MC_sel in the first set writing interval T1 to trigger the change in the cell resistance Rcell.

At an initial stage of the set writing interval Tset, e.g., at time t1, the first voltage V1 may be applied to the word line WL and the second voltage V2 may be applied to the bit line BL so as to apply the pre-write voltage pulse Vpp to the selected memory cell MC_sel. One of the first and second voltages V1 and V2 may be applied to the word line WL or the bit line BL before time t1. The selected memory cell MC_sel is forwardly biased. After that, the set writing current Iset is applied to the word line WL, and accordingly, the set write current Iset may be forced through the word line WL.

After a predetermined write begin time has passed, e.g., at time t2, the cell resistance Rcell begins to change and the cell current Icell increases. After the cell resistance Rcell begins to change, e.g., at time t3, the third voltage V3 is applied to the bit line BL to decrease the voltage applied to the opposite terminals of the selected memory cell MC_sel. The cell current Icell may be maintained at a level of the set write current Iset. During the second set writing interval T2, the word line WL is maintained at the voltage level of the first voltage V1 and the bit line BL is maintained at the voltage level of the third voltage V3, and when the set write current Iset is adjusted, the cell resistance Rcell may be switched to the target set resistance Rset.

Figure 24:
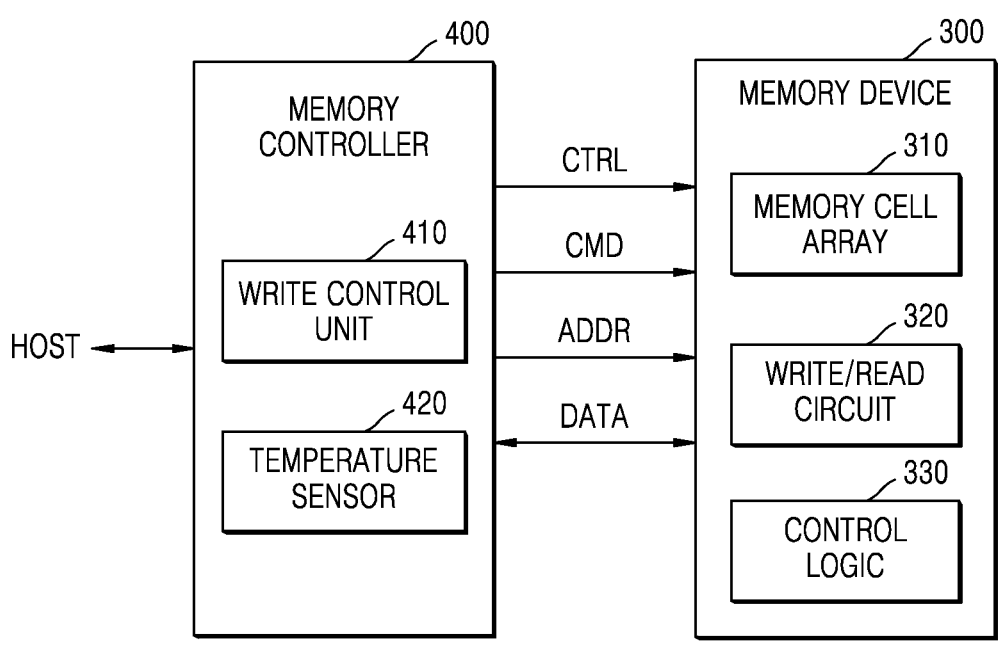
FIG. 24 is a block diagram illustrating a memory system including a memory device according to another embodiment of the inventive concept.

FIG. 24 is a block diagram illustrating a memory system 20 including a resistive memory device 300 according to another embodiment of the inventive concept.

Referring to FIG. 24, the memory system 20 includes the memory device 300 and a memory controller 400. The memory device 300 generally includes a memory cell array 310, a write/read circuit 320, and a control logic 330. The memory controller 400 generally includes a write control unit 410 and a temperature sensor 420.

The write control unit 410 may be used to determine the nature of various signals used during write operations directed to the memory device 300 (e.g., a voltage magnitude of the pre-write voltage pulse, a time interval in which the pre-write voltage pulse is applied, a slew rate of the pre-write voltage pulse, or voltage levels of the voltages configuring the pre-write voltage pulse, etc.). Information regarding these definitions may be communicated via one or more control signals CTRL.

The temperature sensor 420 detects a temperature in the memory system 20, and generates a detection signal. The detection signal is provided to the write control unit 410, and the write control unit 410 may determine the elements regarding the write operation in correspondence with the temperature variation.

Figure 25:
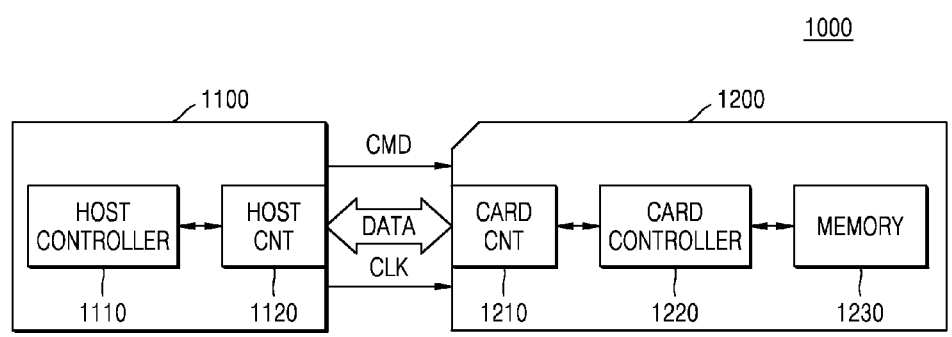
FIG. 25 is a block diagram illustrating a memory system according to an embodiment of the inventive concept, as applied to a memory card system.

FIG. 25 is a block diagram of a memory card system 1000 having a memory system applied thereto, according to an embodiment of the inventive concept.

Referring to FIG. 25, the memory card system 1000 generally includes a host 1100 and a memory card 1200. The host 1100 may include a host controller 1110 and a host connector 1120. The memory card 1200 may include a card connector 1210, a card controller 1220, and a memory device 1230. Here, the memory card 1200 may be embodied by using the embodiments shown in FIGS. 1 through 24.

The host 1100 may write data to the memory 1200 or may read data stored in the memory card 1200. The host controller 1110 may transmit a command CMD, a clock signal CLK generated by a clock generator (not shown) in the host 1100, and data DATA to the memory card 1200 via the host connector 1120.

In response to the command CMD received via the card connector 1210, the card controller 1220 may store the data DATA in the memory device 1230, in synchronization with a clock signal that is generated by a clock generator (not shown) in the card controller 1220. The memory device 1230 may store the data DATA that is transmitted from the host 1100.

The memory card 1200 may be embodied as a compact flash card (CFC), a microdrive, a smart media card (SMC), a multimedia card (MMC), a Security Digital Card (SDC), a memory stick, or a USB flash memory drive.

Figure 26:
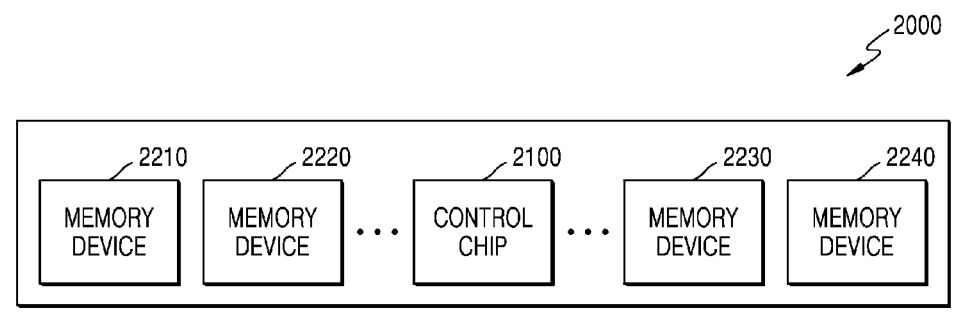
FIG. 26 is a diagram illustrating a resistive memory module according to an embodiment of the inventive concept.

FIG. 26 illustrates a resistive memory module 2000, according to an embodiment of the inventive concept. Referring to FIG. 26, the resistive memory module 2000 may include memory devices 2210 through 2240, and a control chip 2100. Each of the memory devices 2210 through 2240 may be embodied by using the embodiments shown in FIGS. 1 through 23.

In response to various signals transmitted by an external memory controller, the control chip 2100 may control the memory devices 2210 to 2240. For example, according to various commands and addresses that are transmitted from an external source, the control chip 2100 may activate the memory devices 2210 to 2240 corresponding to the various commands and addresses and thus may control write and read operations. Also, the control chip 2100 may perform various post processing operations on read data output from each of the memory devices 2210 to 2240, e.g., the control chip 2100 may perform error detection and correction operations on the read data. Also, the control chip 2100 may control the memory devices 2210 to 2240 so as to adjust the number of inhibit voltages generated by each of the memory devices 2210 to 2240 or the voltage difference between the inhibit voltages.

Figure 27:
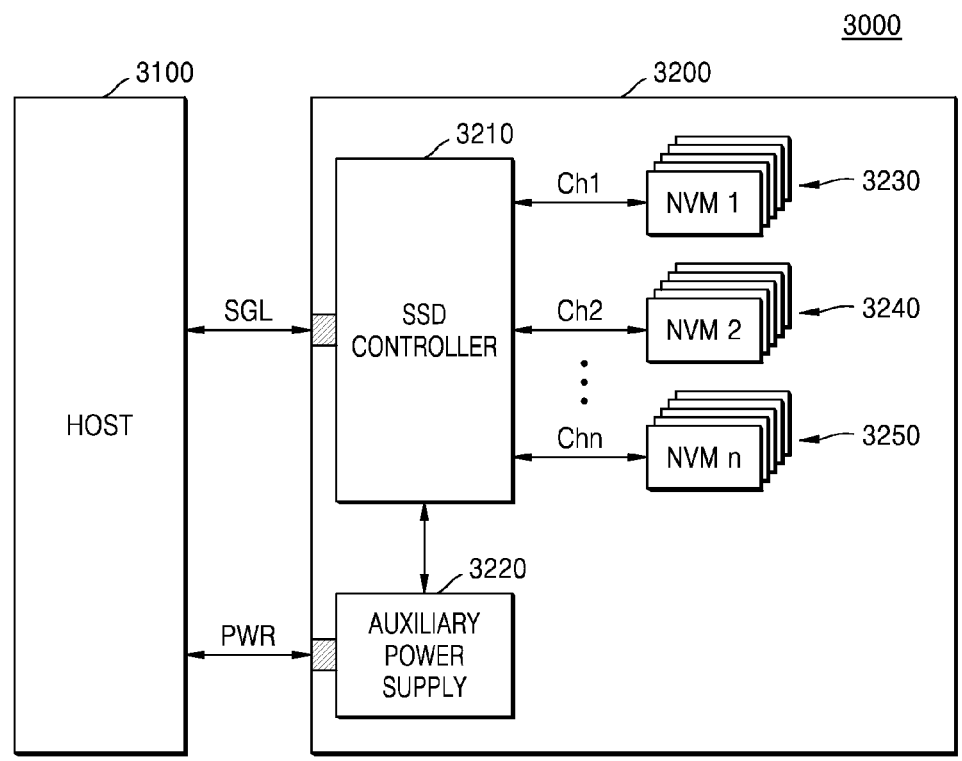
FIG. 27 is a block diagram of an Solid State Disk/Drive (SSD) system to which a memory system according to an embodiment of the inventive concept may be applied.

FIG. 27 is a block diagram illustrating a solid state disk (SSD) system 3000 including a memory system applied thereto, according to an embodiment of the inventive concept.

Referring to FIG. 27, the SSD system 3000 may include a host 3100 and an SSD 3200. The SSD 3200 exchanges signals with the host 3100 via a signal connector, and may receive a power input from a power connector. The SSD 3200 includes an SSD controller 3210, an auxiliary power device 3220, and a plurality of memory devices 3230, 3240, and 3250. Here, the SSD 3200 may be embodied by using the embodiments of FIGS. 1 through 22.

Figure 28:
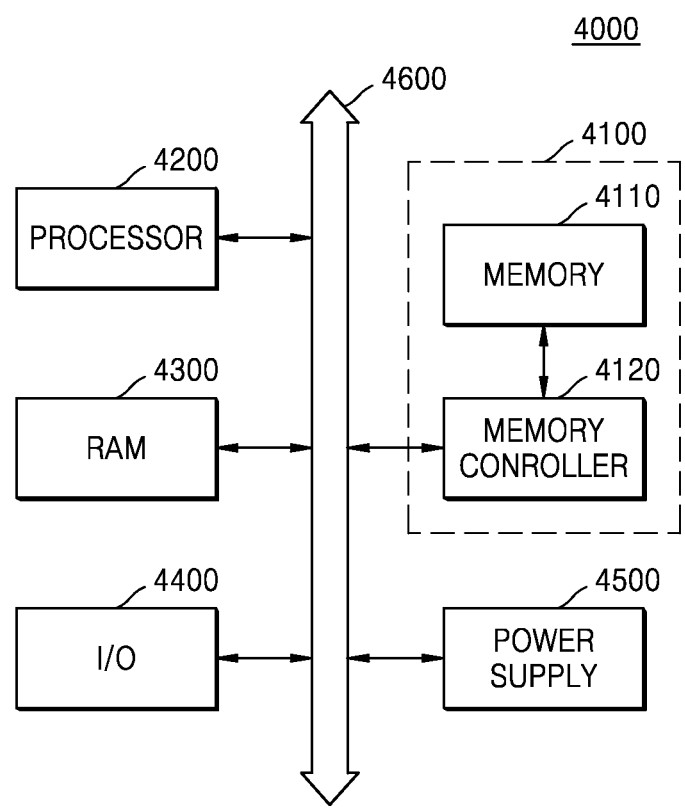
FIG. 28 is a block diagram of a computing system including a memory system according to an embodiment of the inventive concept.

FIG. 28 is a block diagram illustrating a computing system 4000 including a memory system according to an embodiment of the inventive concept.

Referring to FIG. 28, the computing system 4000 may include a memory system 4100, a processor 4200, a RAM 4300, an input/output (I/O) device 4400, and a power supply device 4500. Although not illustrated in FIG. 28, the computing system 4000 may further include ports capable of communicating with a video card, a sound card, a memory card, or a USB device, or other electronic devices. The computing system 4000 may be embodied as a PC, or a portable electronic device such as a notebook computer, a mobile phone, a personal digital assistant (PDA), or a camera.

The processor 4200 may perform particular calculations or tasks. In one or more embodiments, the processor 4200 may be a micro-processor or a Central Processing Unit (CPU). The processor 4200 may perform communication with the RAM 4300, the I/O device 4400, and the memory system 4100 via a bus 4600 such as an address bus, a control bus, or a data bus. Here, the memory system 4100 may be embodied by using the embodiments shown in FIGS. 1 through 24.

In one or more embodiments, the processor 4200 may also be connected to an extended bus such as a Peripheral Component Interconnect (PCI) bus.

The RAM 4300 may store data for operations of the computing system 4000. As described above, the memory device according to the one or more embodiments of the inventive concept may be applied to the RAM 4300. Alternatively, a DRAM, a mobile DRAM, an SRAM, a PRAM, an FRAM, or an MRAM may be used as the RAM 4300.

The I/O device 4400 may include an input unit such as a keyboard, a keypad, or a mouse, and an output unit such as a printer or a display. The power supply device 4500 may supply an operating voltage for the operations of the computing system 4000.

While the inventive concept has been particularly shown and described with reference to embodiments thereof, it will be understood that various changes in form and details may be made therein without departing from the scope of the following claims.

What is claimed is:

1. A method of operating a memory device including a selected memory cell connected to a first signal line and a second signal line in a memory cell array, the method comprising:
    applying a pre-write voltage to the selected memory cell by applying a first voltage to the first signal line and a second voltage to the second signal line during a first set writing interval, wherein a level of the first voltage is higher than a level of the second voltage; and thereafter,
    applying a write voltage to the selected memory cell by applying a third voltage having a level lower than the level of the first voltage and higher than the level of the second voltage to the first signal line during a second set writing interval.

2. The method of claim 1, wherein the second set writing interval is longer than the first set writing interval.

3. The method of claim 1, further comprising:
    supplying a write current pulse to the second signal line after applying the pre-write voltage to the selected memory cell.

4. The method of claim 3, wherein the supplying of write current pulse is performed during at least a part of the first set writing interval and during at least a part of the second set writing interval.

5. The method of claim 3, wherein the supplying of the write current pulse is performed at least in part by restricting a flow of current through the second signal line during the second set writing interval.

6. The method of claim 1, further comprising:
    measuring a temperature in the memory device; and
    defining at least one of a level of the pre-write voltage and a duration of the first set writing interval in response to the measured temperature.

7. The method of claim 6, wherein as the measured temperature increases, the level of the pre-write voltage is decreased.

8. The method of claim 6, wherein as the measured temperature increases, the duration of the first set writing interval is decreased.

9. The method of claim 1, further comprising:
    varying a level of the pre-write voltage in accordance with a physical location of the selected memory cell in the memory cell array.

10. The method of claim 9, wherein as a distance between the selected memory cell and an access node applying the first voltage to the first signal line increases, the level of the pre-write voltage is increased.

11. The method of claim 1, further comprising:
    varying an application slew rate for at least one of the first voltage and the third voltage in accordance with a physical location of the selected memory cell in the memory cell array.

12. The method of claim 11, wherein as a distance between the selected memory cell and an access node applying the first voltage and third voltage to the first signal line increases, the slew rate is increased.

13. The method of claim 1, further comprising:
    applying a third write voltage to the selected memory cell by applying a fourth voltage to the first signal line during a third set writing interval following the second set writing interval, wherein the fourth voltage has a level higher than the level of the second voltage and lower than the level of the third voltage.

14. The method of claim 1, further comprising:
    applying a fourth write voltage to the selected memory cell by applying a fifth voltage to the first signal line during a third set writing interval following the second set writing interval, wherein the fifth voltage has a level than the level of the third voltage and lower than the level of the first voltage.

15. A method of operating a memory device including a selected memory cell connected to among a plurality of memory cells arranged respectively at points in a memory cell array where first signal lines cross second signal lines, the method comprising:
    applying a pre-write voltage to the selected memory cell, and supplying a current pulse to the selected memory cell, wherein the application of the pre-write voltage to the selected memory cell begins a changing of a resistance state of the memory cell; and
    applying a write voltage having a level different from a level of the pre-write voltage to the selected memory cell, wherein application of the write voltage to the selected memory cell suppresses an among of current passing through the selected memory cell relative to the application of the first voltage to the selected memory cell.

16. The method of claim 15, wherein the level of the pre-write voltage is greater than or equal to a voltage level that triggers a change in a resistance of the selected memory cell.

17. The method of claim 15, wherein the level of the write voltage is lower than the level of the pre-write voltage.

18. The method of claim 15, wherein the pre-write voltage and the write voltage are applied to a first signal line connected to the selected memory cell, and the current pulse is supplied to a second signal line.

19. The method of claim 15, wherein the applying of the current pulse is performed during at least part of a first set writing interval during which the pre-write voltage is applied to the selected memory cell, and during a second set writing interval following the first set writing interval during which the write voltage is applied to the selected memory cell.

20. The method of claim 19, wherein the second set writing interval is longer than the first set writing interval.

* * * * *